(12) United States Patent
Hayashi et al.

(10) Patent No.: US 6,327,024 B1
(45) Date of Patent: Dec. 4, 2001

(54) VIBRATION ISOLATION APPARATUS FOR STAGE

(75) Inventors: Yutaka Hayashi, Kanagawa; Hideaki Sakamoto, Tokyo, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/546,181

(22) Filed: Apr. 10, 2000

Related U.S. Application Data

(63) Continuation of application No. 09/241,084, filed on Feb. 1, 1999, which is a continuation of application No. 08/539,080, filed on Oct. 4, 1995, now abandoned.

(30) Foreign Application Priority Data

| Oct. 11, 1994 | (JP) | 6-245358 |
| Dec. 19, 1994 | (JP) | 6-314690 |
| Apr. 10, 1995 | (JP) | 7-83577 |

(51) Int. Cl.$^7$ .......................... G03B 27/42; G03B 27/32; F16M 13/00; F16M 1/00; F16F 15/03
(52) U.S. Cl. ................ 355/53; 355/33; 248/550; 248/638; 188/267; 188/278; 267/136; 267/140.14; 267/140.15
(58) Field of Search .................. 355/33, 53, 248; 248/550, 638; 188/267, 278; 267/136, 140.14, 140.15

(56) References Cited

U.S. PATENT DOCUMENTS

| 3,464,657 | 9/1969 | Bullard | 248/50 |
| 3,703,999 | 11/1972 | Forys | 248/20 |
| 4,525,659 | * 6/1985 | Imahashi et al. | 318/649 |
| 4,679,775 | 7/1987 | Funaki et al. | 267/64.27 |
| 4,850,261 | 7/1989 | Greene | 91/362 |
| 4,887,699 | 12/1989 | Ivers et al. | 188/378 |
| 5,038,835 | 8/1991 | Breyer | 139/1 R |
| 5,121,898 | 6/1992 | Yasuda et al. | 248/550 |
| 5,141,201 | 8/1992 | Mizuno et al. | 248/550 |
| 5,172,160 | 12/1992 | Van Eijk et al. | 355/53 |
| 5,187,519 | * 2/1993 | Takabayashi et al. | 355/53 |
| 5,189,615 | 2/1993 | Rubel et al. | 364/424.05 |
| 5,260,580 | 11/1993 | Itoh et al. | 250/492.2 |
| 5,285,995 | 2/1994 | Gonzalez et al. | 248/550 |
| 5,398,785 | 3/1995 | Leitmann | 188/267 |
| 5,450,931 | 9/1995 | Masuda et al. | 188/268 |
| 5,528,118 | 6/1996 | Lee | 318/568.17 |
| 5,579,084 | 11/1996 | Takahashi et al. | 355/53 |
| 5,832,620 | 11/1998 | Yamaguchi et al. | 33/568 |
| 5,982,128 | 11/1999 | Lee | 318/568.16 |

FOREIGN PATENT DOCUMENTS 6-163353   6/1994   (JP) .

* cited by examiner

Primary Examiner—Russell Adams
Assistant Examiner—Khaled Brown
(74) Attorney, Agent, or Firm—Armstrong, Westerman, Hattori, McLeland & Naughton, LLP

(57) ABSTRACT

A vibration isolation apparatus for preventing shaking and vibration of a stage of an exposure apparatus or the like uses a vibration isolation mount formed of a spring buffer system employing a spring member and a fluid buffer system employing a viscous fluid as a vibration isolation base which is disposed between a base member on which an exposure unit is mounted and an installation surface on which the base member is installed so as to support the base member. The coefficient of viscous drag of the viscous fluid is varied to vary a damping coefficient which depends on the coefficient of viscous drag thereby to vary rigidity of the vibration isolation mount, whereby vibration transmitted from an external source and vibration associated with a stage movement are damped.

55 Claims, 9 Drawing Sheets

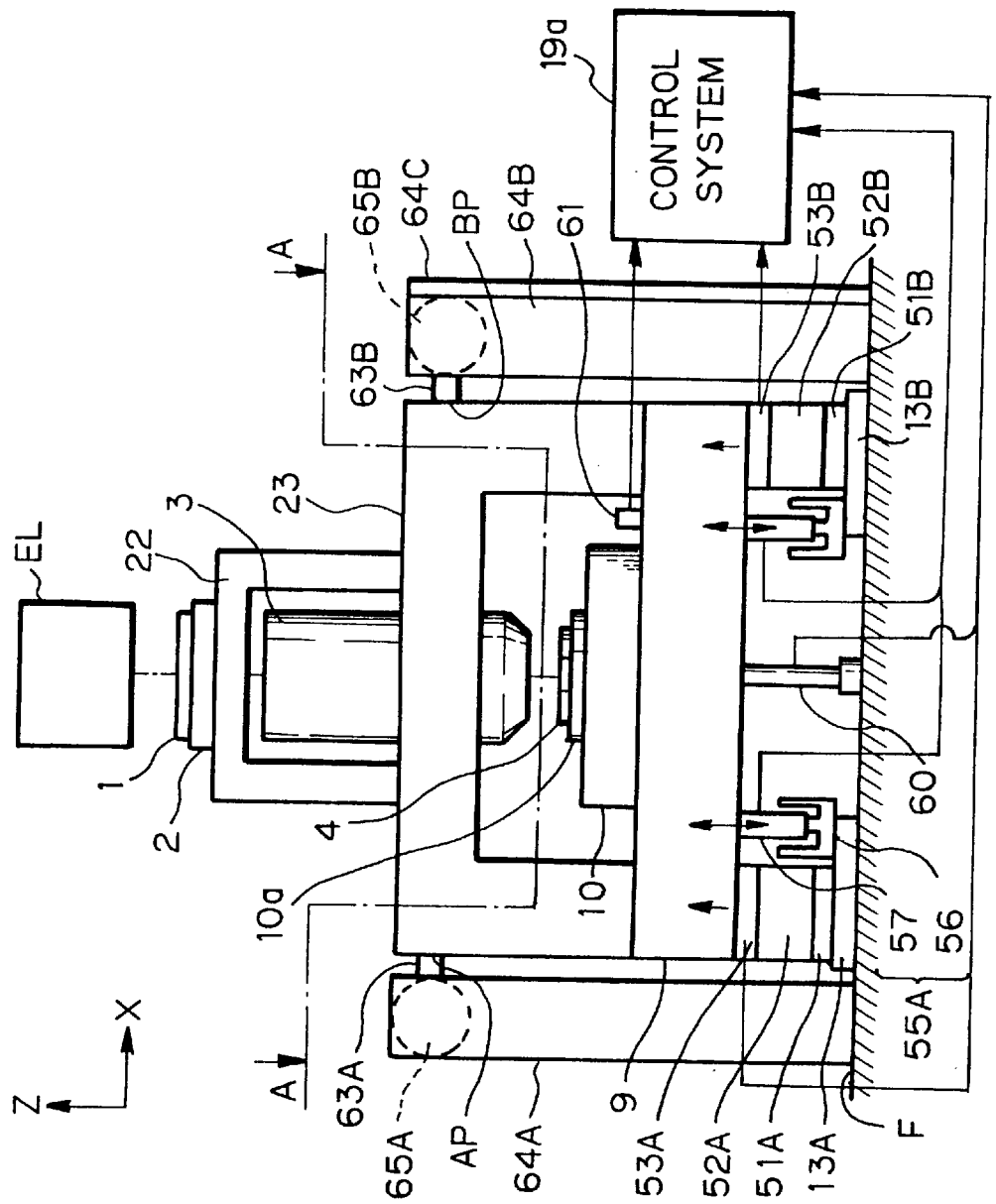

VIBRATION ISOLATION APPARATUS FOR STAGE

This application is a continuation of prior application Ser. No. 09/241,084 filed Feb. 1, 1999, abandoned which is a continuation of prior application Ser. No. 08/539,080 filed Oct. 4, 1995 abandoned.

BACKGROUND OF THE INVENTION

1. Field of the Invention

The present invention relates to a vibration isolation apparatus for a stage which is designed to control vibration in a stage for exposure apparatus used in manufacturing semiconductor devices, liquid crystal display devices and the like.

2. Description of the Related Art

Conventionally, a lithography process in manufacturing semiconductor devices, liquid crystal display devices or the like uses an exposure apparatus (steppers and the like) which transfer a pattern on a mask (reticle or the like) onto shot areas on a substrate (wafer, glass plate or the like) coated with photoresist. For example, in an one-shot exposure type exposure apparatus like a stepper, a process of transferring a pattern on a mask onto each shot area on a substrate requires stable conditions attained by controlling or suppressing vibration of the mask and substrate. To meet this requirement, a surface plate is installed on a floor via vibration isolation bases or mounts held therebetween in order to prevent vibration being directly transmitted from the floor to a portion of the exposure apparatus located above the surface plate (i.e. an exposure unit).

Recently, to meet the need for transferring by exposure a pattern on a wider mask onto a substrate without increasing the size of a projection optical system, scanning exposure apparatus such as step-and-scan exposure apparatus are being used. These apparatus synchronously with scanning a mask in a direction perpendicular to the optical axis of a projection optical system, scans a substrate in a corresponding direction at the same velocity ratio as the magnification of the projection optical system, whereby the pattern on the mask is transferred by exposure onto the substrate in succession. In order to stably scan each of a mask and a substrate at a fixed velocity, it is also necessary that in the scanning exposure apparatus vibration is prevented from being transmitted from a floor to an exposure unit. This is accomplished by installing vibration isolation mounts therebetween.

A conventional vibration isolation apparatus for exposure apparatus will now be described. FIG. 13 shows a schematic construction exemplifying an exposure apparatus provided with a conventional vibration isolation apparatus. In FIG. 13, an exposure unit 11 including a wafer stage WS on which a substrate, i.e. a wafer 4 is mounted, a projection optical system 3, a reticle stage 2 on which a mask, i.e. a reticle 1 is mounted, an illumination optical system EL, columns 22, 23 for supporting those members, and a surface plate 9 for supporting the columns 22, 23 is supported on three or four vibration isolation bases or vibration isolation mounts disposed thereunder. FIG. 13 shows only two vibration isolation mounts 112a, 112b. Separate from the exposure unit 11, there is installed a control rack 28 housing a control system which controls the illumination optical system EL, the reticle stage 2, the wafer stage WS, and a handler (not shown) for loading/unloading the wafer 4 and the reticle 1.

The vibration isolation mounts 112a, 112b are 5 fixed on a base plate 13 so as to maintain their relative position. The vibration isolation mounts 112a, 112b are usually constructed from a combination of a spring material and a vibration damping material. A vibration isolation system as shown in FIG. 13 can be said to be a passive vibration isolation system which does not change vibration isolation performance in accordance with a state of vibration or a state (posture or the like) of the apparatus. Such a vibration isolation mount or vibration isolation base is usually referred to as "a passive vibration isolation mount".

FIG. 14 shows a schematic structure exemplifying another conventional exposure apparatus. In FIG. 14, the exposure unit 11 is also supported on a plurality of vibration isolation mounts as in the above-mentioned example. FIG. 14 shows only two vibration isolation bases or vibration isolation mounts 122a, 122b. The vibration isolation mounts 122a, 122b use an air spring (air damper). The exposure apparatus has an external air source which supplies a positive air pressure of 3 to 10 kgf/cm$^2$ (gauge pressure) to air chambers sealed with rubber or the like of the vibration isolation mounts 122a, 122b through air pipings 126a and 126b, respectively, whereby air springs are constructed.

Flow control valves 124a, 124b are provided immediately before air inlets to the vibration isolation mounts 122a and 122b, respectively. The flow control valves 124a, 124b are adapted to operate in connection with level sensors 125a and 125b, respectively, which are mechanical or electrical space measuring instruments for detecting the posture of the exposure unit 11. That is, as the posture of the exposure unit 11 varies, air flow to the vibration isolation mounts 122a, 122b varies, whereby the exposure unit 11 is maintained in a fixed posture. Other features of FIG. 14 are the same as those of FIG. 13. The vibration isolation mounts 122a, 122b are also called "passive vibration isolation bases" as those in FIG. 13.

By contrast, "an active vibration isolation base" has recently begun to be used which detects a state of external or internal vibrations in real time using a sensor such as an accelerometer, displacement gauge or the like so as to positively affect performance of a vibration isolation mount.

The prior art, however, fails to provide vibration isolation mounts which are satisfactory in terms of both performance and cost.

That is, in an exposure apparatus, in addition to shaking and vibration transmitted from an external source, particularly from a floor, shaking and vibration generated by a stage operation of moving a member to be exposed such as a wafer or the like or a mask (reticle or the like) at a high velocity must be taken into consideration. When a stage is accelerated or decelerated, a large reaction force acts on the exposure apparatus because of the principle of action and reaction. The reaction force becomes a vibration source which transmits vibration to an exposure unit located on a vibration isolation mount. Physically, it is difficult to completely eliminate vibration without drastically modifying the structure of the exposure apparatus. A countermeasure for vibration of this kind is to increase the vibration damping capability as much as possible and to damp vibration as quickly as possible.

What has been discussed above may be summarized as follows. Functions which are required of a vibration isolation base or mount for exposure apparatus are: (a) reduction in the transmission of vibration from a floor and (b) rapid damping of vibration generated within an apparatus.

However, in view of the required performance of a vibration isolation base or mount, these two functions are incompatible with each other. That is, to attain function (a)

"reduction of transmission of vibrations from a floor", a connection between an exposure apparatus and the ground or floor should be made as weak as possible; in other words, a "soft vibration isolation base" having a low rigidity is required. An example of this kind of base is an air spring type vibration isolation base or mount. On the other hand, to attain function (b) "rapid damping of vibration generated within an apparatus", a "hard vibration isolation base" having a high rigidity is required so that the exposure apparatus does not vibrate together with the ground or floor as an integrated unit. The latter function is provided by a vibration isolation mount which uses a mechanical spring having a high rigidity as a component thereof or by means of a rubber vibration isolator or the like.

Conventional passive vibration isolation bases or mounts described above, including vibration isolation mounts which use air springs as well as simpler and cheaper rubber vibration isolators or rubber cushions, have an advantage that a relatively satisfactory vibration isolating performance is obtained at relatively low cost. However, it is difficult for the conventional passive vibration isolation mounts to fulfill the above-mentioned vibration isolating functions which are required in exposure apparatuses.

As for active vibration isolation bases or mounts, sensors are installed inside and outside an apparatus in order to control vibrations based on detection signals issued therefrom to thereby fulfill the aforesaid two functions (a) and (b). Thus, by using the active vibration isolation bases, a vibration isolation system which fully satisfies various requirements for performance can be constructed. However, such a vibration isolation system requires various sensors having a sufficiently high precision and a controller having considerably complex electronic circuits for controlling vibration isolation mounts, leading to higher cost of apparatus. Particularly, a vibration isolation system of this kind which is applicable to recent high-performance exposure apparatus pushes up the cost of apparatus to unacceptably high levels.

On the other hand, as for aforesaid vibration dampers, i.e. vibration isolation mounts, air dampers or mechanical dampers formed of a compression coil spring contained in damping liquid are used. A vibration isolation mount itself has a centering function to a certain degree. Since an exposure apparatus requires an adjustment of height and level, each of four vibration isolation mounts is provided with a mechanical vertical motion mechanism. For example, when an exposure apparatus is relocated, the flatness and inclination of a floor changes, causing the inclination of an exposure unit to also change. To restore an original level, the height of the vibration isolation mounts is adjusted by means of the vertical motion mechanisms.

In the aforesaid conventional vibration isolation bases, by adjusting the vertical motion mechanism provided for each of four vibration isolation mounts, the height and level of the exposure unit can be adjusted. In this case, a plane is usually determined by three points, but the top ends of the four vibration isolation mounts are in contact with the bottom surface of a surface plate because the vibration isolation mounts can expand and contract vertically. However, as the vertical motion mechanisms are adjusted, the magnitude of expansion/contraction changes with each vibration isolation mount. This causes a change in balance among reaction forces which act from the vibration isolation mounts to the surface plate of an exposure apparatus. As a result, the surface plate deforms, leading to a problem of a deterioration in positioning accuracy or the like of a stage located on the surface plate.

Vibration isolation mounts, if provided, can shut off most vibrations transmitted from the floor to the exposure unit. However, it takes a relatively long time to damp the exposure unit, for example, by a stepping operation of a wafer stage. Accordingly, processing involves a time required for vibration to be damped, leading to a problem that the throughput (productivity) of an exposure process cannot be increased.

SUMMARY OF THE INVENTION

A primary object of the present invention is to provide a low-cost vibration isolation apparatus for a stage which fulfills the following two functions: reduction in transmission of vibration from a floor to the stage of an exposure apparatus; and rapid damping of vibration generated within the exposure apparatus.

Another object of the present invention is to provide a vibration isolation apparatus for a stage which can maintain balance among reaction forces which act from a plurality of vibration isolation mounts disposed under the bottom surface of a base member such as a surface plate or the like to the base member, in a desired state.

A further object of the present invention is to provide a vibration isolation apparatus for a stage which can quickly damp vibration which is generated on a base member mounted on vibration isolation mounts.

Still another object of the present invention is to provide a vibration isolation apparatus for a stage which can quickly damp horizontal vibration of the stage and rotational vibration about a vertical axis thereof.

A vibration isolation apparatus according to the present invention includes a base member on which an object to be processed is mounted, three or more vibration damping devices which are disposed on an installation surface for the base member so as to support the base member and which damp vibration between the installation surface and the base member, and a damping characteristic adjusting or varying device for varying at least either one of spring constant and damping coefficient of predetermined one or more of a plurality of vibration damping devices in accordance with the state of movement of the object to be processed.

In the aforesaid vibration isolation apparatus of the present invention, the predetermined one or more vibration damping devices have, for example, a movable body disposed in a predetermined viscous fluid. In this case, preferably, the damping characteristic varying device varies the coefficient of viscous drag of the viscous fluid so as to vary the damping coefficient.

Also, a stage apparatus according to the present invention includes a substrate stage for moving a photosensitive substrate two-dimensionally, a base member on which the substrate stage is mounted, three or more vibration damping devices which are disposed on an installation surface for the stage apparatus so as to support the base member and which damp vibration between the installation surface and the base member, and a damping characteristic adjusting or varying device for varying at least either one of spring constant and damping coefficient of predetermined one or more of a plurality of vibration damping devices in accordance with the state of movement of the substrate stage.

In the aforesaid stage apparatus of the present invention, an example of the predetermined one or more vibration damping devices has a movable body disposed in a predetermined viscous fluid. In this case, preferably, the damping characteristic varying device varies the coefficient of viscous drag of the viscous fluid to vary the damping coefficient.

Another example of the damping characteristic adjusting or varying device is adapted to vary the spring constant by inserting a spring member between the installation surface and the base member in parallel with vibration damping devices whose damping characteristic is to be varied or removing from therebetween.

Another example of means for varying the spring constant is a device which uses an electrical actuator, for example, for varying a gain of position feedback to indirectly vary the spring constant or for directly varying the spring constant which is represented with applied force/deformation.

According to the aforesaid vibration isolation apparatus of the present invention, the damping characteristic varying device varies the spring constant or damping coefficient of the vibration damping devices in accordance with a state of movement of an object to be processed, whereby the vibration damping characteristic of the stage apparatus can be changed. Accordingly, for example, to prevent vibration from being transmitted to the stage apparatus from outside, the spring constant is reduced. On the other hand, for example, to quickly converge vibration which is generated within an apparatus in association with a movement of an object to be measured, the damping coefficient is increased, whereby the rigidity of the stage apparatus is increased to cope with thus generated vibration.

Also, according to the stage apparatus of the present invention, the following two functions which are required of the stage apparatus of an exposure apparatus can be fulfilled at low cost: (a) reduction of transmission of vibration from a floor and (b) quick damping of vibration generated within an apparatus.

As has been described before, it is not necessary to fulfill the two functions which are required of the stage apparatus of an exposure apparatus, at the same time. Function (a) is most required to be fulfilled at a time when patterns on a mask are printed by exposure onto a photosensitive substrate and when various optical alignment operations are performed. Function (b) is important at a time when the substrate stage is accelerated or decelerated in a stepping operation where the substrate stage is moved at high velocity.

Hence, for example, in the vibration isolation apparatus or stage apparatus, if the vibration damping characteristic of the vibration damping devices is set to change in two ways, the stage apparatus which fulfills both functions (a) and (b) will result in view of functions of an exposure apparatus. That is, rigidity may be "softened" only at the time of exposure. Also, rigidity may be "hardened" at other time associated with acceleration/deceleration of the stages, whereby vibrations associated with acceleration/deceleration of the stages can be stilled (settled) sufficiently quickly.

Meanwhile, the above-mentioned time-course control is exercised by the damping characteristic varying devices. In this connection, it is not necessary to prepare special sensors and controllers for changing the setting of the vibration damping devices. That is, the damping characteristic varying device may generate a control signal in accordance with operating conditions of an exposure apparatus to thereby control an operation of viscous fluid, for example. Accordingly, the stage apparatus of the present invention can attain functions of an active vibration isolation base at a lower cost as compared with the aforesaid active vibration isolation mount.

Furthermore, in an exposure apparatus, a combination of drive and halt of the stage apparatus is involved not only in an exposure operation but in various optical alignment operations and an operation of transferring a mask or photosensitive substrate to and from a handler for replacement. Control parameters like a drive velocity and acceleration of the substrate stage are usually different for each case of the operations. Accordingly, "rigidity" to be set for the vibration damping devices is not at the two stages, "soft" and "hard", but is set at several stages for individual cases, preferably at four or five stages. According to the stage apparatus of the present invention, these plural rigidity values can be easily set by the damping characteristic varying device.

A second vibration isolation apparatus according to the present invention, for example, as shown in FIGS. 10 to 12, has a base member on which an object to be processed is mounted, three or more vibration damping devices which are disposed between the base member and an installation surface in different positions, a plurality of load sensors for detecting a load which is placed by the base member on each of the vibration damping devices, and a plurality of height adjusting devices for adjusting the height of the vibration damping devices in accordance with the results of detection by the load sensors.

In this case, preferably, a plurality of vibration controlling or suppressing devices for controlling or suppressing vibrations of the base member in the direction of height are disposed between the base member and the installation surface in parallel with the vibration damping devices.

A third vibration isolation apparatus according to the present invention, for example, as shown in FIGS. 10 to 12, includes a base member on which a mobile stage is mounted for positioning an object to be processed in first and second directions intersecting each other, four vibration damping devices which are disposed between the base member and the installation surface in different positions, four load sensors for detecting a load which is placed by the base member on each of the four vibration damping devices, four height adjusting devices for adjusting the height of the four vibration damping devices in accordance with the results of detection by the four load sensors, four first vibration controlling or suppressing devices which are disposed in parallel with the four height adjusting devices and which suppress vibration of the base member in the direction of height, two or more second vibration controlling or suppressing devices for controlling or suppressing vibration of the base member in the first direction, and one or more third vibration controlling or suppressing devices for controlling or suppressing vibration of the base member in the second direction.

In this case, preferably, points of application of the second vibration controlling devices for controlling vibration of the base member in the first direction and a point of application of the third vibration controlling device for controlling vibration of the base member in the second direction are made substantially equal in height to the center of gravity of a system formed of the base member and the mobile stage.

When the above-mentioned first and second vibration isolation apparatus are applied to an exposure apparatus, an object to be processed is a photosensitive substrate, and an exposure unit for transferring by exposure mask patterns onto the photosensitive substrate is mounted on the base member.

According to the second vibration isolation apparatus of the present invention, for example, when an apparatus is relocated, the inclination of an installation surface (floor or the like) changes, and hence the height and level of the base member are adjusted using the height adjusting devices for the vibration damping devices. For example, when there are four or more vibration damping devices, adjustment with the height adjusting devices provides many combinations of amounts of height adjustment for attaining a predetermined height and inclination of the base member. Accordingly, some combinations may cause a change in balance among reaction forces which the base member receives from the vibration damping devices.

In the present invention, therefore, reaction forces received from the vibration damping devices are directly measured using the load sensors, whereby amounts of adjustment with the height adjusting devices are controlled so as to maintain balance among reaction forces received from the vibration damping devices. Thus, the base member is prevented from deforming.

Furthermore, when a plurality of vibration controlling devices for controlling vibrations of the base member in the direction of height are disposed between the base member and the installation surface in parallel with the vibration damping devices, the vibration suppressing devices damp vibration which is generated above the base member.

According to the third vibration isolation apparatus of the present invention, the heights of the four vibration damping devices are adjusted with four height adjusting devices so as to attain a predetermined state of balance among reaction forces which are measured by means of four load sensors. Furthermore, vibration having six or more degree-of-freedom and generated on the base member are suppressed using four first vibration suppressing devices for suppressing vibration in the direction of height, two or more second vibration suppressing devices for suppressing vibration in the first direction, and one or more third vibration suppressing devices for suppressing vibration in the second direction.

In this case, when points of application of the second vibration suppressing devices for controlling or suppressing vibration of the base member in the first direction and a point of application of the third vibration suppressing device for controlling or suppressing vibration of the base member in the second direction are made substantially equal in height to the center of gravity of a system comprising the base member and the mobile stage, rotation about the first and second directions is restrained. Also, rotation about a direction (Z-direction) perpendicular to the first and second directions and translation motion in the first and second directions can be controlled with the second vibration suppressing devices and the third vibration suppressing device, whereby interaxis interference is minimized.

BRIEF DESCRIPTION OF THE DRAWINGS

FIG. 10 is a schematic front view of a projection exposure apparatus to which a vibration isolation apparatus according to a still further embodiment of the present invention is applied;

DETAILED DESCRIPTION OF THE PREFERRED EMBODIMENTS

A vibration isolation apparatus and a stage apparatus according to an embodiment of the present invention will now be described with reference to FIGS. 1 to 3 and FIG. 8. The present embodiment is herein applied to a step-and-repeat projection exposure apparatus in which patterns on a reticle are reduced through a projection optical system and transferred by exposure onto shot areas on a wafer.

Figure 1:
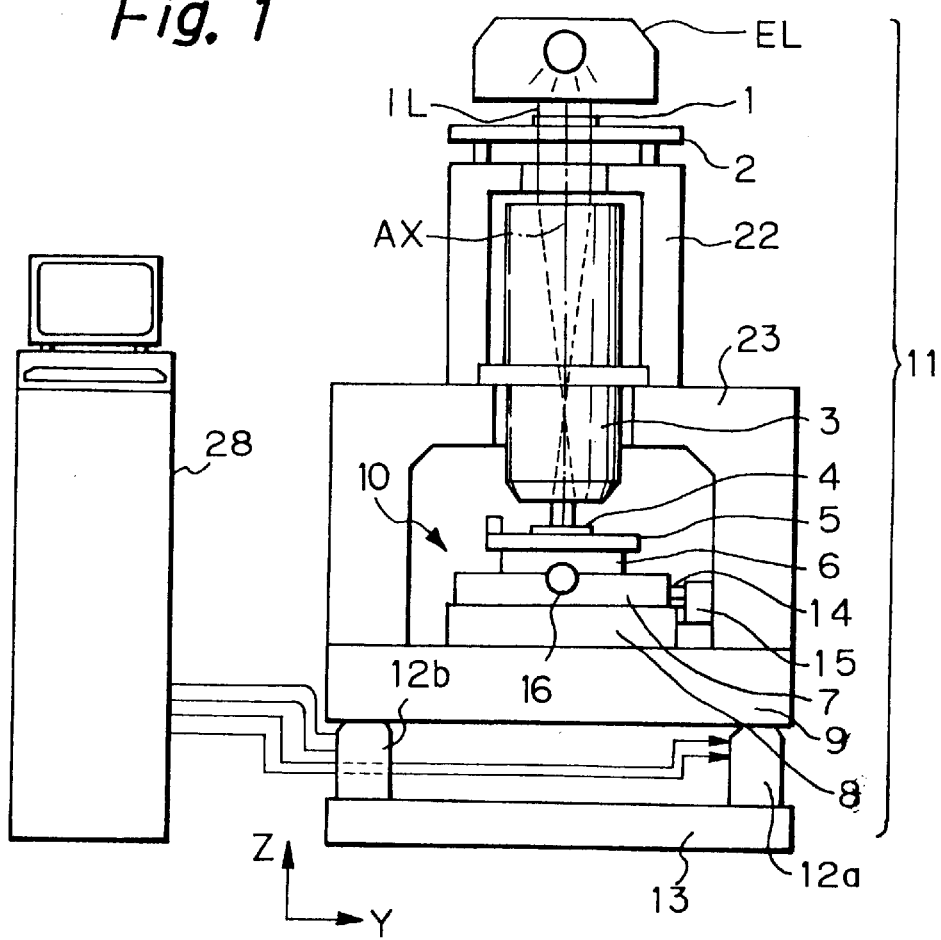
FIG. 1 is a schematic general view showing an exposure apparatus to which a vibration isolation apparatus for a stage according to an embodiment of the present invention is applied.

FIG. 1 is a schematic general view of a projection exposure apparatus to which the present embodiment is applied. In FIG. 1, illumination light IL for exposure use which is emitted from an illumination optical system EL illuminates an illumination area on a mask, i.e. a reticle 1, whereby circuit patterns drawn in the illumination area are reduced through a projection optical system 3 and transferred by exposure onto the surface of a substrate, i.e. a wafer 4. A bright-line (i-line having a wavelength of 365 nm, g-line having a wavelength of 436 nm and the like) of a mercury lamp or the like and a laser beam such as KrF excimer laser beam, ArF excimer laser beam and the like are used as the illumination light IL. In FIG. 1, a Z-axis is taken in parallel with an optical axis AX of the projection optical system 3, a Y-axis is taken on a plane perpendicular to the optical axis AX in parallel with the page of FIG. 1, and an X-axis is taken perpendicular to the page of FIG. 1.

In FIG. 1, the reticle 1 on which circuit patters are drawn is vacuum chucked on a mask stage, i.e. a reticle stage 2. The reticle stage 2 positions the reticle 1 in the X direction, Y direction, and rotational direction (θ-direction) on a two-dimensional plane (XY plane) perpendicular to the optical axis AX of the projection optical system 3. Position coordinates on the two-dimensional plane of the reticle stage 2 is always detected at a resolution of about 0.01 μm for example, with a movable mirror (not shown) located on the reticle stage 2 and a peripheral laser interferometer (not shown).

As shown in FIG. 1, the substrate, i.e. the wafer 4 is vacuum chucked on a wafer holder (not shown). The wafer holder is fixed on a Z stage 5. The Z stage 5 is mounted on an X stage 6 which can move in the X direction more than a distance equal to the diameter of a largest wafer which undergoes exposure on the projection exposure apparatus. The X stage 6 is mounted on a Y stage 7 which can move in the Y direction more than a distance equal to the diameter of the largest wafer. A wafer base is composed of the Z stage 5, the X stage 6, the Y stage 7, and a wafer base 8.

The Y stage 7 is driven by a motor 15 via a feed screw 14 and moves in the Y direction relative to the wafer base 8. The X stage 6 is driven by a motor 16 via a feed screw (not shown) and moves in the X direction relative to the Y stage 7. The Z stage 5 can be tilted in any direction with respect to an imaging plane of the projection optical system 3 and moved finely along the optical axis AX (in the Z direction) by a not-shown drive. Also, the Z stage can rotate about the optical axis AX.

Furthermore, X- and Y-coordinates of the Z stage 5 are always measured with a movable mirror fixed on the Z stage 5 and an external laser interferometer (not shown).

Also, there is provided an oblique incident type focus position detection system (not shown) having an illumination optical system which projects an image of a pinhole, slit pattern or the like obliquely to the optical axis AX toward the exposure face of the wafer 4 located near the imaging plane of the projection optical system 3, and a light receiving optical system which re-forms the image from luminous flux reflected from the projected image. A position of the surface of the wafer 4 in the Z direction is detected by the focus position detection system. Based on thus detected information, an autofocus operation is performed so that the surface of the wafer 4 coincides with the imaging plane of the projection optical system 3. The focus position detecting system is disclosed in U.S. Pat. No. 4,650,983.

As has been described above, the exposure unit 11 is mounted on four vibration dampers or vibration isolation mounts, the exposure unit 11 including the wafer stage 10 composed of the Z stage 5, the X stage 6, the Y stage 7, and the wafer base 8, the illumination optical system EL, the projection optical system 3, the reticle stage 2, the columns 22 and 23 for supporting the optical systems and the reticle stage 2, and the base member or surface plate 9 for supporting the columns 22 and 23. FIG. 1 shows only two vibration isolation mounts 12a, 12b. The vibration isolation mounts 12a, 12b are fixed on the base plate 13 so as to maintain a relative position thereof. The vibration isolation mounts 12a, 12b will be described in detail later. The exposure unit 11 is also provided with an alignment system (not shown) for aligning the reticle 1 with the wafer 4.

A control system 19 (see FIG. 2) housed in an external control rack 28 controls the illumination optical system EL, the reticle stage 2, the wafer stage, and a handler (not shown) for loading/unloading the wafer 4 and the reticle 1 and also controls the operation of the vibration isolation mounts 12a, 12b.

The vibration damper or vibration isolation mount 12a will now be described with reference to FIG. 2. The description is also applicable to the vibration isolation mount 12b and other vibration isolation mounts. The vibration mount 12a is in an integral structure of a vibration absorbing system employing a spring member and a vibration absorbing system employing a viscous fluid. For convenience of description, a structure of the vibration absorbing system employing a spring member is referred to as a spring buffer system, and a structure of the vibration absorbing system employing a viscous fluid is referred as a fluid buffer system.

The vibration isolation mount 12a according to the present embodiment is a structure formed of the spring buffer system and the fluid buffer system.

Figure 2:
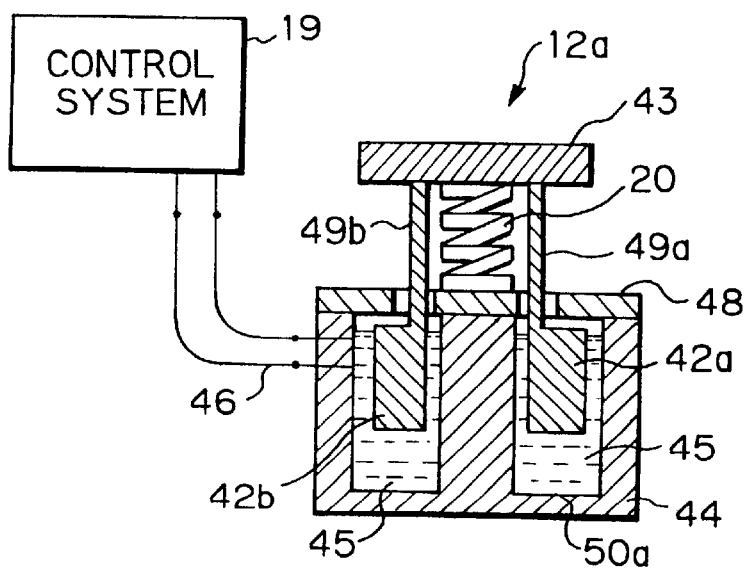
FIG. 2 is a cross-sectional view showing the internal structure of a vibration isolation mount of the vibration isolation apparatus of FIG. 1.

FIG. 2 is a cross-sectional view showing the internal structure of the vibration isolation mount 12a according to the present embodiment. In FIG. 2, a top member 43 is connected to the exposure unit 11 of FIG. 1, and the bottom surface of a case 44 is fixed on the base plate 13 of FIG. 1 which serves as an installation surface. One end of the spring member 20, which is a component of the spring buffer system of the present embodiment, is fixed to a cover 48 of the case 44 at a central portion. The other end of the spring member 20 is fixed to the top member 43. A plurality of blade-shaped members (FIG. 2 shows only two of them, 42a and 42b), which are components of the fluid buffer system of the present embodiment, are attached to the top member 43 in such a manner that they surround the spring member 20. Handles 49a and 49b, fixed to the top member 43, of the blade-shaped members 42a and 42b, respectively, are loosely fitted in an opening in the cover 48.

A cylindrical container 50a having a thick-wall and being housed in the case 44 is filled with a viscous fluid 45, which is a primary component of the fluid buffer system of the present embodiment, in a leak-free state. Blade portions of the blade-shaped members 42a, 42b are immersed in the viscous fluid 45. A pair of electrodes 46 is provided on the surface of the case 44. Electrical conduction is established between the electrodes 46 and the viscous fluid 45. The viscous fluid 45 is an ER (electrorheological) fluid which changes viscosity thereof with voltage as described later. When a voltage applied by an external power source between the electrodes 46 changes, viscosity of the viscous fluid 45 changes. As a result, a damping coefficient of the vibration isolation mount 12a changes. Viscosity of the viscous fluid 45 is controlled by the external control system 19 which is installed separately from the vibration isolation mount 12a.

The viscous fluid 45 which is a component of the fluid buffer system of the present embodiment will now be described.

As described above, the viscous fluid 45 is an ER fluid, which changes viscosity thereof with voltage applied thereto. An ER fluid, when left intact, is a colloidal solution which is fluid. When an electric field of several kV/mm is applied to an ER fluid, the ER fluid loses its fluidness in proportion to the intensity of electric field. An ER fluid of some kind changes to a state of near solid. Furthermore, for an ER fluid, a response speed of a change in viscosity is about 0.1 sec, for example. A response speed provided by an ER fluid is fully applicable to stepper type and step-and-scan type projection exposure apparatus, for example.

ER fluids are divided into a diffusion type in which particles having electric polarity characteristics are dispersed in insulating fluid such as silicone oil or the like and a recently available liquid crystal type which uses liquid crystal. A diffusion type ER fluid is cheap, but has a disadvantage that dispersed particles separate from solution. On the other hand, a liquid crystal type ER fluid has an advantage that particles do not separate and that the ER effect is not lost even in a higher shear rate zone where diffusion type ER fluids lose the ER effect, but has a drawback of higher prices. Various ER fluids are marketed by various manufacturers including Asahi Chemical Industry Co., Ltd., Nippon Oil Company, Nippon Shokubai Co., Ltd., Nippon Mektron, Ltd., Dow Corning Corp., and Toray Corp.

Of the marketed ER fluids, an ER fluid which provides a large change in coefficient of viscosity, good responsibility, small power consumption, excellent dispersion of particles, a wide range of operating temperature, and a low price is selected as the viscous fluid 45.

The operation of the stage apparatus according to the present embodiment will now be described.

Figure 3:
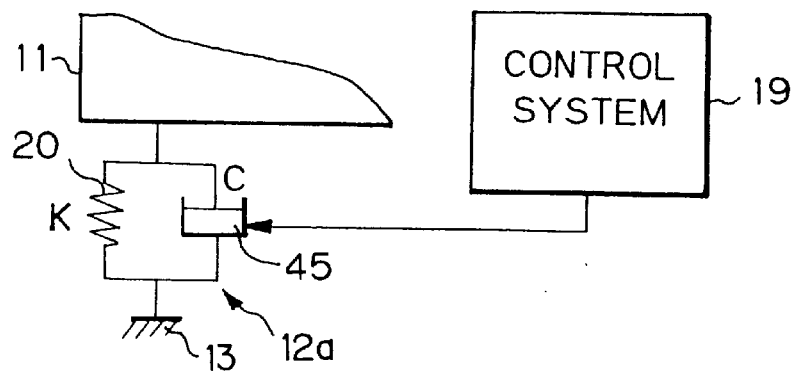
FIG. 3 is a view showing a vibration model of the vibration isolation mount of FIG. 2.

FIG. 3 is a view illustrating a vibration model of the vibration isolation mount 12a which is used in the present embodiment. In FIG. 3, the vibration characteristic of the vibration isolation mount 12a, which is disposed between the exposure unit 11 and the installation surface of the exposure apparatus, i.e. the base plate 13 so as to support the exposure unit 11, is determined by the spring constant K of the spring member 20 (FIG. 2) and the damping coefficient C which depends on the coefficient of viscous drag of the viscous fluid 45 (FIG. 2), which is a vibration damping member.

In the present embodiment, the spring constant K of the spring member 20 is fixed. Accordingly, by varying the damping coefficient C, which depends on the coefficient of viscous drag of the viscous fluid 45, the vibration characteristic of the vibration isolation mount 12a is varied. According to the present embodiment, an ER fluid is used as the viscous fluid 45. At present, an ER fluid which allows the coefficient of viscosity of the viscous fluid 45 to change by ten times or more by controlling a voltage applied thereto is commercially available from a variety of sources. By using such an ER fluid, control can be exercised over the height of a peak of a resonance magnification at a characteristic frequency in a low frequency zone and the transmissibility of vibration in medium and high frequency zones.

As described before, it is not necessary for the vibration isolation base or mount of an exposure apparatus to fulfill the two required functions, i.e. (a) reduction of transmission of vibration from floor and (b) quick damping of vibration generated within apparatus, at the same time. Function (a) is most required to be fulfilled at a time when patterns on the reticle 1 are printed by exposure onto the wafer 4 and when various optical alignment operations are performed. Function (b) is important at a time when the wafer stage and the reticle stage 2 are accelerated or decelerated in an operation of moving the wafer stage and the reticle stage 2 at a high velocity.

Figure 8:
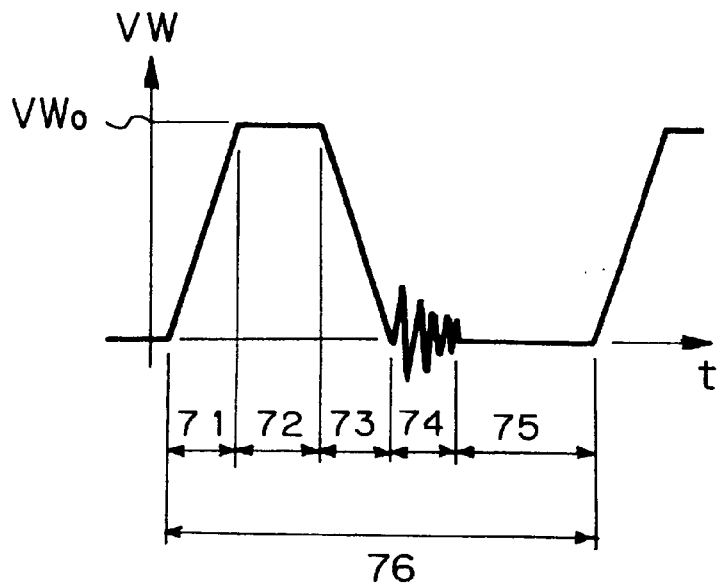
FIG. 8 is a graph showing a state of velocity control of a wafer stage of the exposure apparatus of FIG. 1.

FIG. 8 is a graph illustrating the timing of drive and exposure for the wafer stage in the stepper type projection exposure apparatus to which the present embodiment is applied. The axis of abscissa represents time t, and the axis of ordinate represents the velocity of the wafer stage, VW. First, the wafer stage accelerates at period 71, undergoes a uniform motion at period 72, and decelerates at period 73. Immediately after the deceleration, at period 74, fine positioning is performed. On completion of the positioning, at stationary period 75, exposure is performed. A total time 76 is the sum of periods 71 to 75. The wafer stage repeatedly undergoes this cycle of drive and exposure. The velocity VW represented by the axis of ordinate indicates a maximum driving velocity of the wafer stage.

For example, in the vibration isolation apparatus according to the present embodiment, if the vibration damping characteristic of vibration dampers or vibration isolation mounts 12a, 12b which form a vibration damping apparatus is set to vary in two ways, a vibration isolation base which fulfills both functions (a) and (b) will result in view of functions of an exposure apparatus. That is, rigidity may be "softened" only at the time of exposure, i.e. period 75. In other words, viscosity of the viscous fluid 45 may be reduced. This substantially shuts off transmission of vibration from outside the apparatus. Also, rigidity may be "hardened" at other time associated with acceleration/deceleration of the stages, whereby vibration associated with acceleration/deceleration of the stages can be stilled sufficiently quickly.

Meanwhile, the above-mentioned time-course control is exercised by the control system 19 (FIG. 2) for controlling the entire exposure apparatus. In this connection, it is not necessary to prepare special sensors and controller for changing the characteristic of the vibration isolation mounts 12a and 12b of the present embodiment. That is, the control system 19 may generate a control signal in accordance with operating conditions of the exposure apparatus thereby to control a voltage applied to the viscous fluid 45. Accordingly, the stage apparatus according to the present embodiment can attain functions of an active vibration isolation base at a lower cost as compared with active vibration isolation bases.

Furthermore, in the exposure apparatus, a combination of drive and halt of stages such as the reticle stage 2 and the wafer stage is applied not only to an exposure operation but to various optical alignment operations and an operation of transferring the wafer 4 and the reticle 1 to and from the handler for replacement. Control parameters like a drive velocity and acceleration of the stages are usually different for each case of the operations. Accordingly, "rigidity" to be set for the vibration isolation mounts 12a, 15 12b is not at the two stages, "soft" and "hard", but is to be at several stages for individual cases, preferably at four or five stages. In a method of the present embodiment where viscosity of the viscous fluid 45 is varied, these plural stages of "rigidity" can be easily set by the control system 19.

A vibration isolation apparatus according to another embodiment of the present invention will now be described with reference to FIG. 4.

Figure 4:
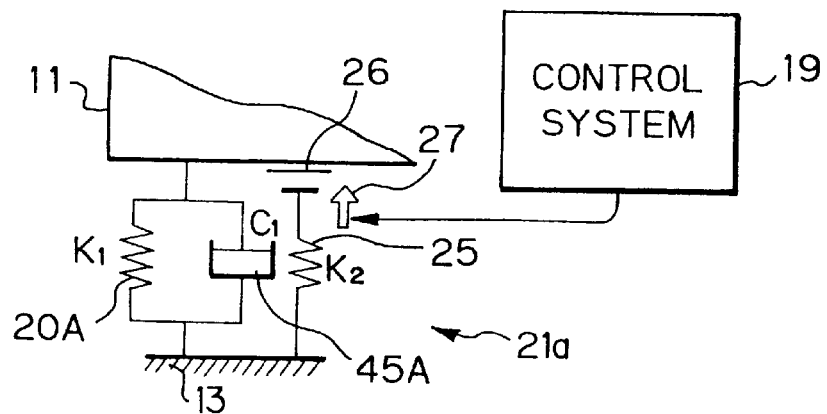
FIG. 4 is a view showing a vibration model of a stage provided with a vibration isolation apparatus according to another embodiment of the present invention.

FIG. 4 is a view illustrating a vibration model of a vibration damper or vibration isolation mount 21a of the present embodiment. The present embodiment uses the vibration isolation mount 21a which is fixed in damping coefficient $C_1$ and which allows a spring constant to vary, in place of the vibration mount 12a in the embodiment of FIG. 1. As shown in FIG. 4, one or more spring members 25 are removably provided near and in addition to an integral structure of a fluid buffer system employing a viscous fluid 45A and a spring member 20A. In this case, the spring member 25 may be or may not be integrated with the fluid buffer system employing the viscous fluid 45A. Also, in the vibration isolation apparatus according to the present embodiment, four vibration isolation mounts are provided as in FIG. 1.

In FIG. 4, one end of one or more spring members 25 is fixed on the base plate 13, but the other end is not always in contact with the exposure unit 11. Control is exercised such that the other end and an opposed surface 26 of the exposure unit 11 are engaged with or disengaged from each other by a drive apparatus 27. Various drive systems which utilize an electromagnetic force, a vacuum chucking force, a pneumatic force, a mechanical operation activated by a motor and the like can be used as the drive apparatus 27 which performs the engaging/disengaging operation. The control system 19 controls the drive apparatus 27 so as to perform the engagement and disengagement. Other structural features are identical to those of the vibration isolation apparatus of FIG. 1.

The operation of the vibration isolation mount 21a of the present embodiment will now be briefly described with reference to the vibration model of FIG. 4. When the vibration isolation mount 21a is provided with a plurality of spring members, the spring members are different in spring constant. The description below, however, uses a spring constant $K_2$ for representing the spring constants. That is, let the spring constant $K_2$ vary by the number of variations derived from combinations of the spring members 25. The operation of the viscous fluid 45A is not controlled by the control system 19, and the coefficient of viscous drag of the viscous fluid 45A mostly depends on ambient temperature only. Accordingly, the damping coefficient $C_1$ is considered to be constant at room temperature.

In the vibration isolation mount 21a, in addition to using the damping characteristic of the viscous fluid 45A, by changing a spring constant $K_T$ which is determined by a combination of the spring constant $K_1$ of the spring member 20A and the spring constant $K_2$ of the spring member 25, it is possible to set many more vibration characteristic values than the embodiment of FIG. 1.

Taking the number of the spring members 25 as n and representing a combination of n things taken i at a time with $_nC_1$ the total number P of variations of the spring constant $K_2$ is expressed as $(1+_nC_1+_nC_2+ \ldots +_nC_n)$.

For example, when there are three spring members 25, a total number of variations of the spring constant $K_2$ is 8. The spring constant $K_T$ does not vary continuously, but the spring constant $K_T$ which varies nearly continuously can be obtained by preparing a predetermined number of the spring members 25. Accordingly, by combining the spring member 20A, a plurality of the spring members 25, and the viscous fluid 45A, it is possible to meet various vibration characteristic requirements for the stage apparatus.

According to the present embodiment, the vibration isolation mount 21a is constructed of a combination of a spring buffer system employing the spring members 20A and 25 and a fluid buffer system employing the viscous fluid 45A. The fluid buffer system, however, may be omitted. However, a combination of the spring buffer system and the fluid buffer system is more effective.

A stage apparatus according to a further embodiment of the present invention will now be described with reference to FIG. 5. In the present embodiment, the spring constant of a vibration isolation mount is varied as in the example of FIG. 4. An auxiliary vibration damper or vibration isolation mount 30 which uses an actuator 31 of a voice coil motor (hereinafter referred to as VCM) type is provided near a vibration damper or vibration isolation mount 28a which is formed of a spring buffer system employing a spring member 20B with a spring constant $K_3$ and a fluid buffer system employing a viscous fluid 45B with a damping coefficient $C_2$. The stage apparatus according to the present embodiment is also provided with four vibration isolation mounts as in the example of FIG. 1.

Figure 5:
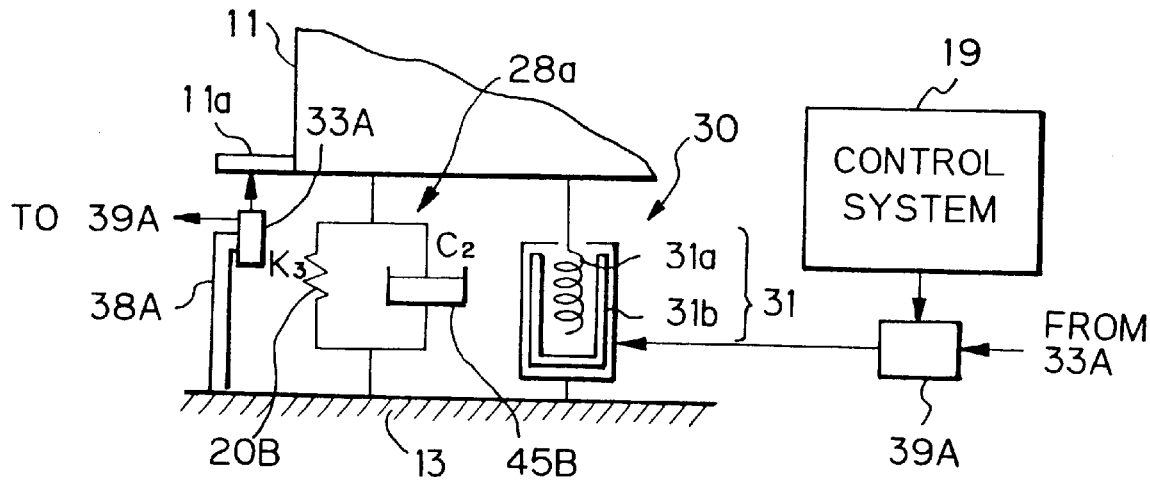
FIG. 5 is a view showing a vibration model of a stage provided with a vibration isolation apparatus according to a further embodiment of the present invention.

FIG. 5 is a view illustrating a vibration model of a vibration isolation mount of the present embodiment. As shown in FIG. 5, the auxiliary vibration isolation mount 30 whose bottom portion is fixed on the base plate 13 is provided near the vibration isolation mount 28a. The VCM actuator 31 which forms the vibration isolation mount 30 is composed of a coil portion 31a fixed to the exposure unit 11 and a magnet portion 31b fixed to the vibration isolation mount 30a. A force which is applied from the base plate 13 to the exposure unit 11 varies according to current which flows to the coil portion 31a.

The position of the exposure unit 11 is measured by means of a position sensor 33A which is located so as to face the bottom portion of the exposure unit 11 and which detects the position (height) of a projection 11a projecting from the bottom portion of the exposure unit 11. The position sensor 33A is fixed on the base plate 13 via a support frame 38A. The relative position between the position sensor 33A and the base plate 13 is fixed. A measurement by the position sensor 33A is supplied to a position gain circuit 39A. The position gain circuit 39A controls the VCM actuator 31 of the auxiliary vibration isolation mount 30 so as to generate a force at a pre determined gain in such a direction that a deviation measured with the position sensor 33A is brought to zero. According to the present embodiment, the control system 19 changes a position gain in the position gain circuit 39A, whereby the spring constant of the VCM actuator 31 is indirectly changed. Various length measuring sensors can be used as the position sensor 33A. In view of cost, laser reflection type sensors, eddy current sensors and the like are preferable. Other structural features are identical to those of the stage apparatus of FIG. 1.

A stage apparatus according to still another embodiment of the present invention will now be described with reference to FIG. 6. The present embodiment uses a motor driven feed screw type actuator as a vibration isolation mount and is not provided with a vibration isolation mount which is formed from a spring buffer system and a fluid buffer system as in the above-mentioned embodiment. The stage apparatus according to the present embodiment is also provided with four vibration isolation mounts as in FIG. 1.

Figure 6:
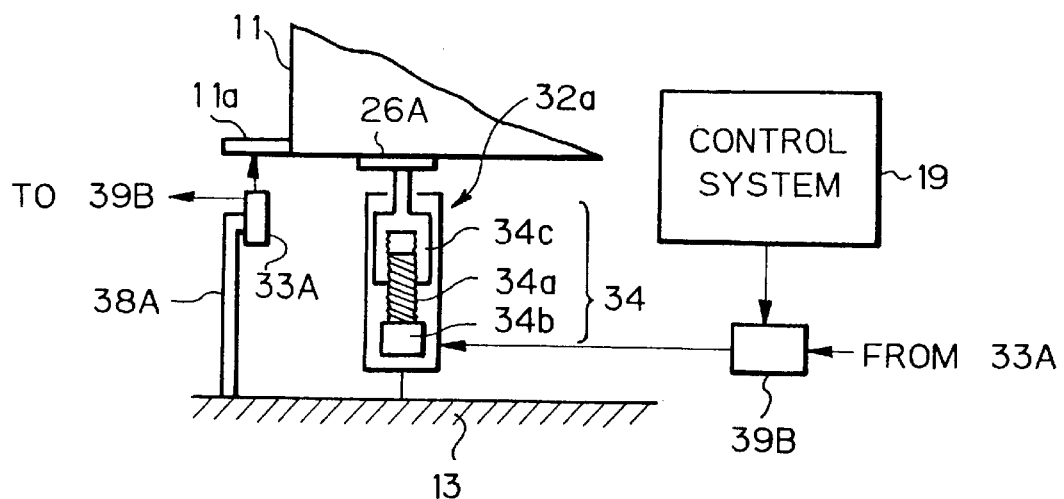
FIG. 6 is a view showing a vibration model of a stage provided with a vibration isolation apparatus according to still another embodiment of the present invention.

FIG. 6 is a view illustrating a vibration model of a vibration isolation mount of the present embodiment. In FIG. 6, there is provided a vibration damper or vibration isolation mount 32a whose bottom portion is fixed on the base plate 13. An electrical actuator 34 which forms a drive mechanism of the vibration isolation mount 32a is composed of a spindle 34c which abuts on an opposed surface 26A of the exposure unit 11, a threaded portion 34a which engages with the nut portion of the spindle 34c, and a drive motor 34b for rotating the threaded portion 34a. The bottom portion of the vibration isolation mount 32a is fixed on the base plate 13 to absorb vibration transmitted from the exposure unit 11.

The position of the exposure unit 11 is measured by means of the position sensor 33A which detects the position of the projection 11a projecting from the bottom portion of the exposure unit 11 as in the stage apparatus of FIG. 5. A measurement with the position sensor 33A is supplied to a position gain circuit 39B. The position gain circuit 39B controls at a predetermined position gain a force which the actuator 34 applies to the exposure unit 11, in such a manner that a deviation measured by means of the position sensor 33A is brought to zero. Also in the present embodiment, the control system 19 adjusts a position gain in the position gain circuit 39B so as to vary the spring constant in the actuator 34. Other structural features are identical to those of the stage apparatus of FIG. 1.

In contrast to the VCM actuator 31 of FIG. 5, the actuator 34 formed of a feed screw and a drive motor is applicable by itself to an apparatus having a large load. However, the actuator 34 may be used together with a vibration isolation mount formed of a spring buffer system and a fluid buffer system.

A modified embodiment of the stage apparatus of FIG. 5 will now be described with reference to FIG. 7. In the present embodiment, a load cell is disposed between the auxiliary vibration isolation mount 30 of FIG. 5 and the exposure unit 11.

Figure 7:
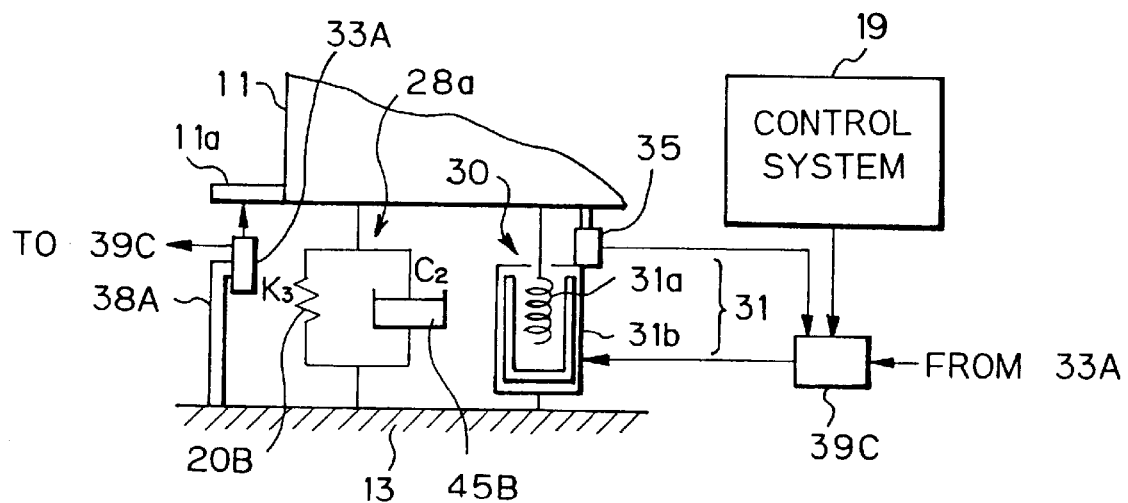
FIG. 7 is a view showing a vibration model of a modified embodiment of the vibration isolation apparatus of FIG. 5.

FIG. 7 is a schematic view illustrating a vibration model of a vibration isolation mount of the present embodiment. In FIG. 7, a load cell 35 is disposed between the bottom surface of the exposure unit 11 and the top face of the external cylinder of a vibration damper or vibration isolation mount 30 having the VCM actuator 31. The load cell 35 supplies a load measurement to a drive circuit 39C. The drive circuit 39C also receives a position measurement from the position sensor 33A. The drive circuit 39C controls a force applied by the VCM actuator 31 so as to bring a spring constant to a predetermined value, the spring constant being a value obtained by dividing a load, i.e. a force detected by the load cell 35 by a deviation (displacement) detected by the displacement sensor 33A. The control system 19 changes the spring constant in the drive circuit 39C as required. Other structural features are identical to those of the stage apparatus of FIG. 5.

The operation of the vibration isolation mount of the present embodiment will now be briefly described with reference to the vibration model of FIG. 7.

In addition to changing the damping characteristic of the viscous fluid 45B, by changing the spring constant $K_T$ which is determined by a combination of the spring constant $K_3$ of the spring member 20B and a spring constant $K_A$ of the VCM actuator 31 which forms the auxiliary vibration isolation mount 30, the vibration damper or vibration isolation mount of the present embodiment can provide various damping characteristics.

Taking a force imposed on the load cell 35 as a working force F and a positional deviation of the exposure unit 11 as a displacement $\Delta x$, a value obtained by dividing the working force F by the displacement $\Delta x$ (F/$\Delta x$) is equivalent to a usual spring constant if the VCM actuator 31 is considered as a spring material. Accordingly, the spring constant KA is represented with F/$\Delta x$. To vary the spring constant $K_A$, the working force F for the same displacement $\Delta x$ may be varied. Thus, the control system 19 controls current to be flowed to the coil 31a, whereby the spring constant KA of the VCM actuator 31 can be varied.

According to the method of the present embodiment, since the auxiliary vibration isolation mount 30 formed of the VCM actuator 31 is provided, the spring constant $K_T$ of the entire vibration isolation apparatus can be varied over a wide range only by electrically controlling the VCM actuator 31 through the drive circuit 39C, whereby it is possible to meet various vibration characteristic requirements for the vibration isolation apparatus.

In vibration isolation apparatus according to the embodiments described above, vibration isolation mounts formed of a spring buffer system and a fluid buffer system are disposed between the exposure unit 11 and the base plate 13 serving as the installation surface of an exposure apparatus so as to buffer vibration including that associated with movement of the reticle stage 2 and wafer stage of the exposure apparatus and vibration transmitted from the installation surface, whereby performance of the exposure apparatus can be improved.

An air spring may be used as a spring member in the above-mentioned embodiments. Also, a pneumatic buffer system employing, for example, an air cylinder or the like may be used as a fluid buffer system.

The stage apparatus according to the embodiments described above is herein applied to a stepper type projection exposure apparatus, but is also applicable to a scanning exposure apparatus of a step-and-scan type in which a reticle and a wafer are synchronously scanned.

Figure 9:
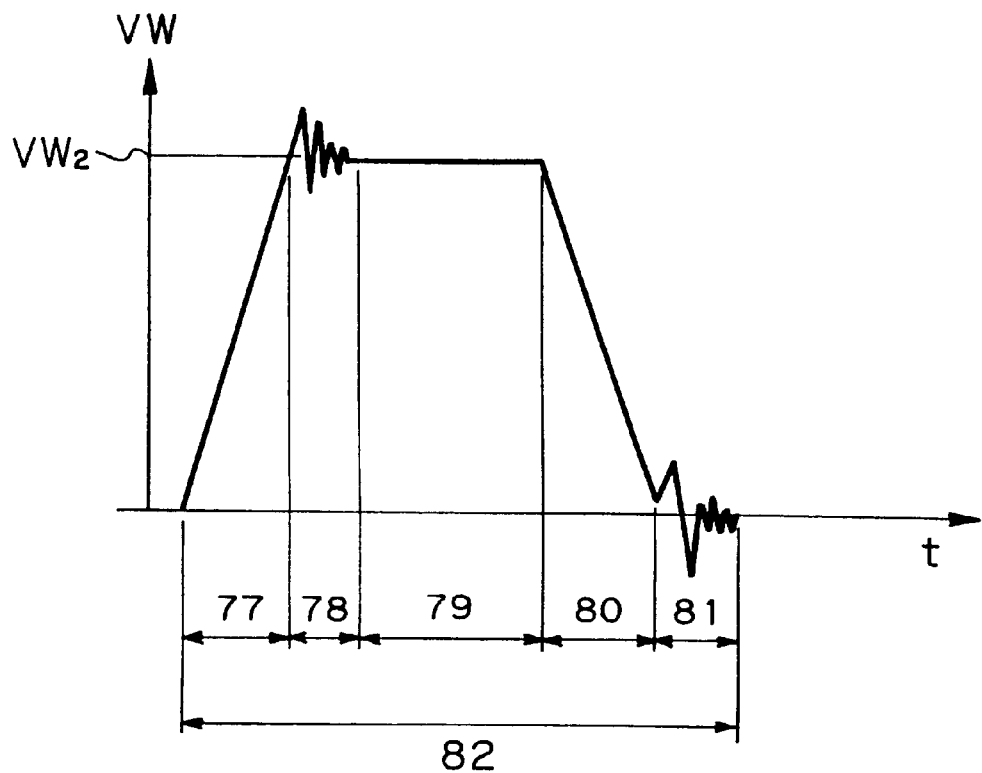
FIG. 9 is a graph showing a state of velocity control of a wafer stage of a step-and-scan exposure apparatus.

FIG. 9 is a graph illustrating the timing of drive and exposure for the wafer stage of a step-and-scan exposure apparatus. The axis of abscissa represents time t, and the axis of ordinate represents the velocity of the wafer stage, VW. As shown in FIG. 9, the wafer stage accelerates at period 77, converges to a predetermined scanning velocity at period 78, and undergoes exposure at period 79 when the scanning velocity is fixed. During period 79, the wafer stage moves at a scanning velocity $VW_2$. On completion of exposure, at period 80, the wafer stage decelerates. Immediately after the deceleration, at period 81, positioning to a scanning start position is performed for the next exposure shot. A total time 82 is the sum of periods 77 to 81. The wafer stage repeatedly undergoes this cycle of drive and exposure.

As in the stage apparatus of a stepper type exposure apparatus, rigidity may be "decreased" only at the time of exposure, i.e. period 79. At another time associated with acceleration/deceleration of the wafer stage, rigidity may be "increased", whereby vibration derived from acceleration/deceleration of the wafer stage can be damped sufficiently quickly.

In the above-mentioned embodiments, a compression coil spring is used as a spring member. However, a plate spring, an iron plate or the like may also be used as the spring member.

Another modified embodiment of the vibration isolation apparatus of the present invention will now be described with reference to FIG. 10 or FIG. 12. In the present modified embodiment, load sensors and height adjusting devices are provided in combination with vibration dampers or vibration isolation mounts which are disposed between a surface plate and a floor or installation surface. Also, devices for damping transverse (horizontal) vibration of an entire exposure apparatus are provided.

FIG. 10 shows a projection exposure apparatus provided with the vibration isolation apparatus according to the present modified embodiment. In FIG. 10, four bases 13A, 13B, . . . (FIG. 10 shows only bases 13A and 13B) are provided on the floor or installation surface. Vibration dampers or vibration isolation mounts 52A to 53D which form a vibration damping apparatus are disposed on the four bases 13A, 13B, . . . , respectively, with respective vertical motion mechanisms 51A to 51D held therebetween. Load sensors 53A to 53D are mount ed on the vibration mounts 52A to 52D, respectively. The surface plate 9 of the projection exposure apparatus is mounted on the load sensors 53A to 53D. Also, in the present modified embodiment, a Z-axis is taken in parallel with the optical axis of the projection optical system 3, an X-axis is taken on a plane perpendicular to the Z-axis in parallel with the paper of FIG. 10, and a Y-axis is taken perpendicular to the paper of FIG. 10.

Figure 12:
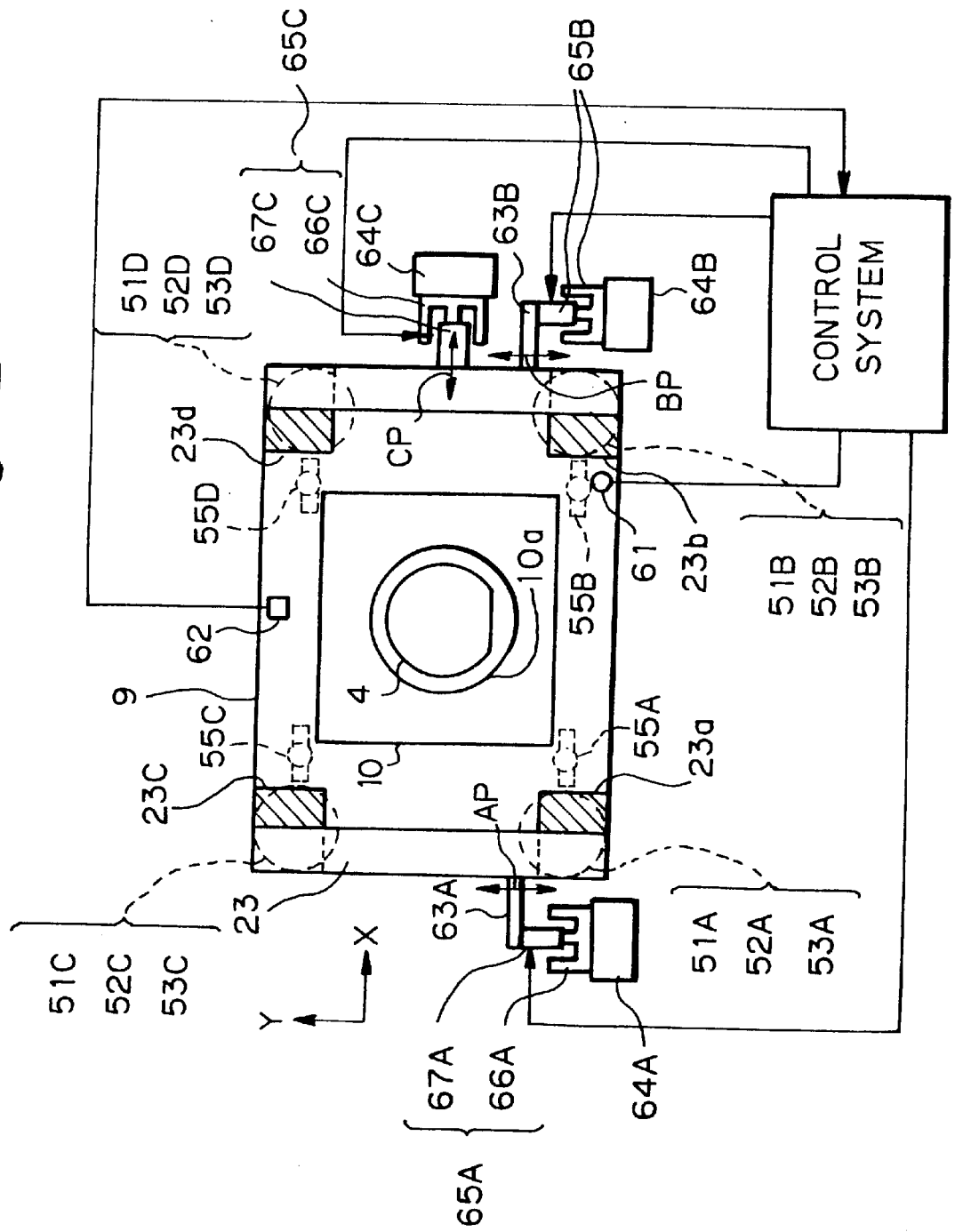
FIG. 12 is a cross-sectional view along the line A—A of FIG. 10.
Figure 13:
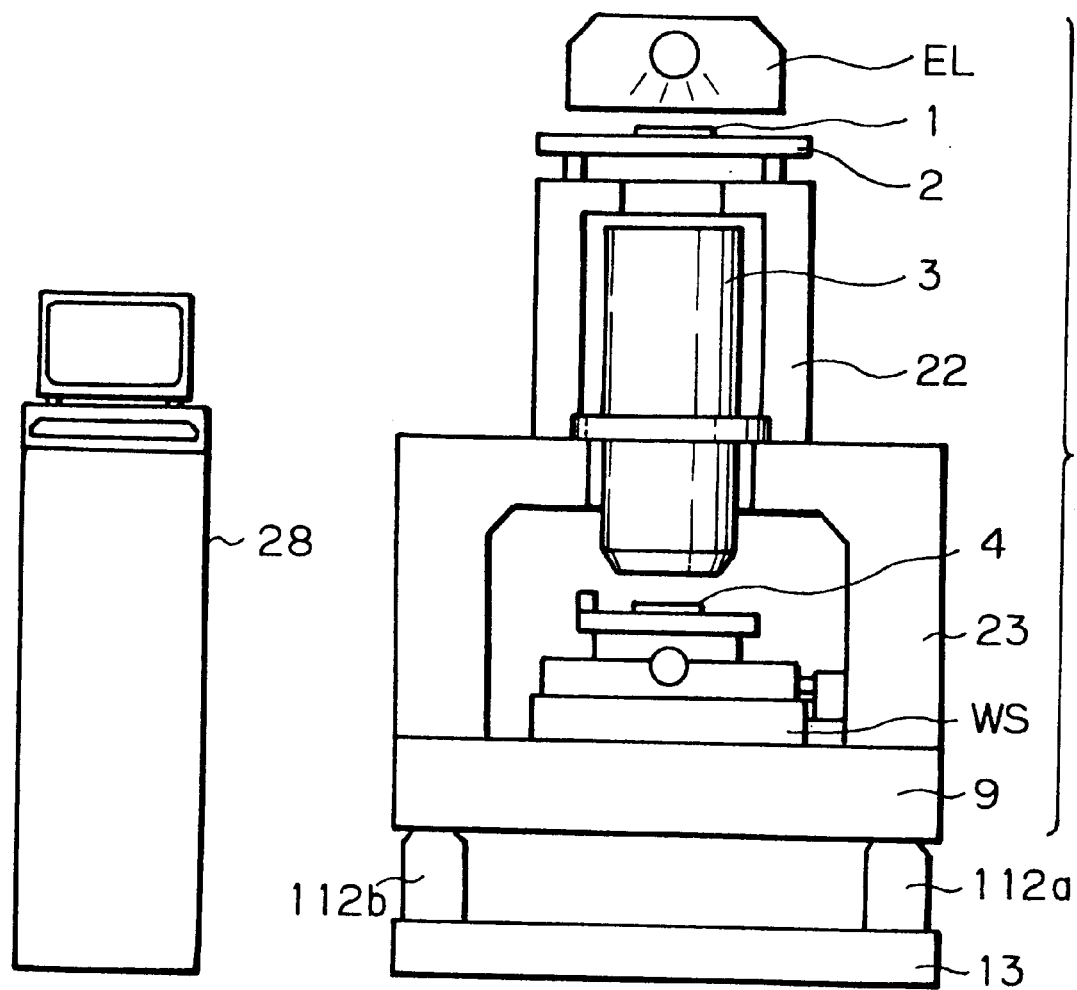
FIG. 13 is a schematic general view exemplifying an exposure apparatus to which a conventional vibration isolation apparatus for a stage is applied.
Figure 14:
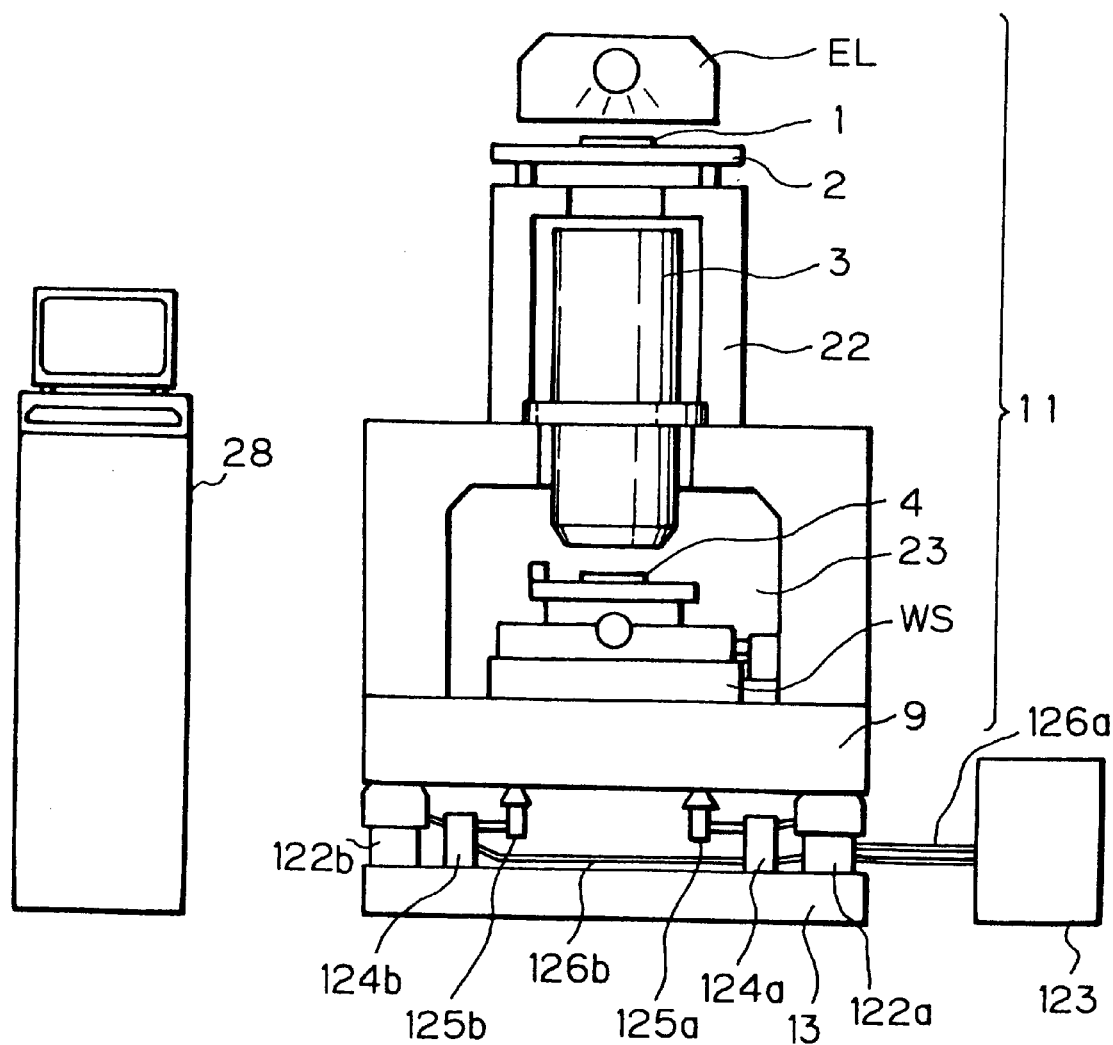
FIG. 14 is a schematic general view exemplifying another exposure apparatus to which a conventional vibration isolation apparatus for a stage is applied.

FIG. 12 is a cross-sectional view along the line A—A of FIG. 10. As shown in FIG. 12, the vertical motion mechanisms 51A to 51D, the vibration isolation mounts 52A to 52D, and the load sensors 53A to 53D are disposed on the surface plate 9 near four corners thereof. As for the vertical motion mechanisms 51A to 51D, for example, a motor driven height adjusting mechanism is used which adjusts height by turning, a screw with a motor. The controller 19a for controlling the entire projection exposure apparatus controls an amount of height adjustment (in the Z direction) of the vertical motion mechanisms 51A to 51D. As for the vibration isolation mounts 52A to 52D, the vibration isolation mounts 12a, 21a, 28a, . . . according to the above-mentioned embodiments may be used, and also an air damper, a mechanical damper in which a compression coil spring is contained in a damping fluid, and other similar dampers may be used. When an air damper is used as the vibration isolation mounts 52A to 52D, the height of the vibration isolation mounts 52A to 52D can be adjusted by an air pressure. Thus, the air dampers can serve both as the vertical motion mechanisms 51A to 51D and the vibration isolation mounts 52A to 52D. Also, a load cell formed of a strain gauge or the like can be used as the load sensors 53A to 53D. The controller 19a is inputted of a load which is placed by the surface plate 9 and measured by the load sensors 53A to 53D, i.e. a reaction force in the Z direction which acts from the vibration isolation mounts 52A to 52D to the surface plate 9.

Back in FIG. 10, an actuator 55A is provided between the base 13A and the surface plate 9 in parallel with the vibration isolation mount 52A. The actuator 55A is formed of a stationary element 56 which is fixed on the base 13A and a movable element 57 which is fixed on the bottom surface of the surface plate 9. The actuator 55A generates a pushing force which is directed in the Z direction from the base 13A to the bottom surface of the surface plate 9 or a pulling force which is directed from the bottom surface of the surface plate 9 to the base 13A. Also, actuators 55B to 55D are provided in parallel with the vibration isolation mounts 52B to 52D, respectively, as for the vibration isolation mount 52A. A pushing or pulling force which is generated by the actuators 55B to 55D is also set by the controller 19a. Since the actuators 55A to 55D are identical in structure, only the structure of the actuator 55A will be described.

Figure 11A:
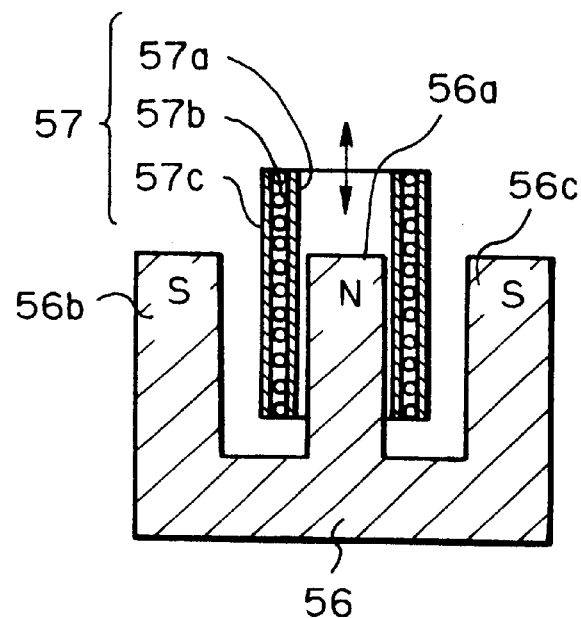
FIG. 11($a$) is an enlarged cross-sectional view exemplifying an actuator shown in FIG. 10, and FIG. 11($b$) is an enlarged cross-sectional view exemplifying another actuator.

FIG. 11(a) shows the actuator 55A of the present embodiment. As shown in FIG. 11(a), the stationary element 56 is a magnetizing body which is formed from an N-pole shaft 56a and S-pole shafts 56b and 56c located at both sides of the shaft 56a. The movable element 57 is composed of an inner cylinder 57a which is loosely fitted to the shaft 56a, a coil 57b which is wound around the outer surface of the inner cylinder 57a, and an outer cylinder 57c for covering the coil 57b. By regulating current which flows in the coil 57b, a force is generated between the stationary element 56 and the movable element 57 in parallel with the shaft 56a (in ±Z direction).

Figure 11B:
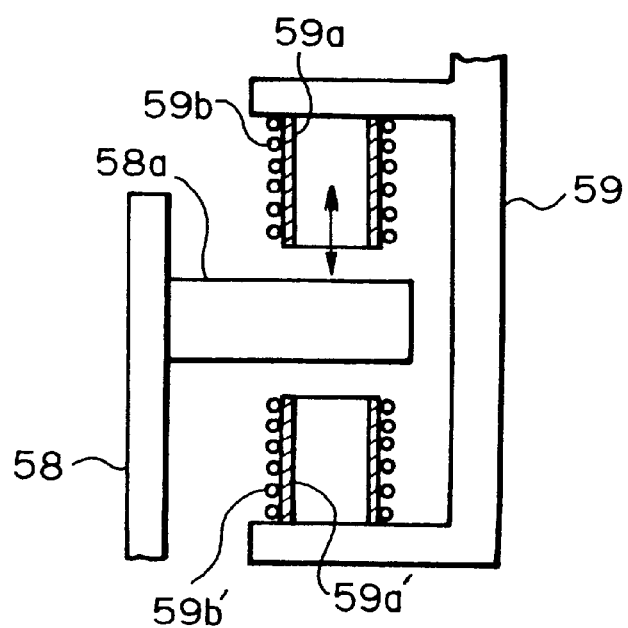

FIG. 11(b) shows another example of the actuator 55A. As shown in FIG. 11(b), a stationary element 58a formed of a magnetic substance is fixed to a first member 58, and inner cylinders 59a and 59b are fixed to second member 59 in such a manner that the stationary element 58a is located therebetween, and also coils 59a' and 59b' are wound around the outer surface of the inner cylinders 59a and 59b, respectively. Also, in this case, by regulating current which flows in the coils 59a' and 59b', the balance of attraction between the first member 58 and the second member 59 is varied so as to generate a force.

Back in FIG. 10, a displacement sensor 60 is provided between a floor F and the surface plate 9 at the central portion of the bottom surface of the surface plate 9 in order to detect a displacement of the surface plate 9 in the Z direction with respect to the floor F. The result of detection by the displacement sensor 60 is also supplied to the controller 19a. A potentiometer having a resolution of 0.1 mm or so or a photoelectric linear encoder for example may be used as the displacement sensor 60.

The wafer stage 10 is fixed on the surface plate 9, and the wafer 4 is vacuum chucked by a wafer holder 10a on the wafer stage 10. A first column 23 is fixed to the surface plate 9 in a manner that it surrounds the wafer stage 10. The projection optical system 3 is fixed on the top plate of the first column 23 at a central portion. A second column 22 is fixed to the top plate of the first column 23 in a manner that it surrounds the projection optical system 3. The reticle 1 is mounted on the reticle stage 2 which is located at the central portion of the top plate of the second column 22. The wafer stage 10 has a function of positioning in three dimensions the wafer 4 and rotating and leveling the wafer 4. The reticle stage 2 has a function of finely adjusting a two-dimensional position of the reticle 1 and adjusting a rotation angle of the reticle 1. The illumination optical system EL is located above the reticle 1. The reticle 1 is illuminated with illumination light for exposure which is emitted from the illumination optical system EL. An image of a pattern on thus illuminated reticle 1 is formed through the projection optical system 3, and thus formed image is transferred by exposure to shot areas on the wafer 4 with one shot area after another.

As shown in FIG. 12, a level sensor 61 for detecting inclination of the surface plate 9 and an acceleration sensor 62 for detecting acceleration of the surface plate 9 are provided on the surface plate 9 near the wafer stage 10. The results of detection by the level sensor 61 and the acceleration sensor 62 are supplied to the controller 19a. The acceleration sensor 62 functions to detect pitching (rotation on the XZ plane), yawing (rotation on the YZ plane), and acceleration in a rotational direction on the XY plane (angular acceleration) as well as acceleration in the X, Y, and Z directions. That is, the acceleration sensor 62 functions to detect an acceleration having six degrees-of-freedom.

Furthermore, a movable shaft 63A is fixed to the side wall of the first column 23 (or the surface plate 9) on the side of the −X direction, and an actuator 65A is located between the movable shaft 63A and a support 64A fixed on the floor. Like the actuator 55A, the actuator 65A is composed of a stationary element 66A formed of a magnetizing body and a movable element 67A including a coil attached to the movable shaft 63. The controller 19a regulates current which flows through the coil in the movable element 67A, whereby a force can be applied to the movable shaft 63A in the +Y or −Y direction.

Likewise, a movable shaft 63B is implanted in the side wall of the first column 23 (or the surface plate 9) on the side of the +X direction, and an actuator 65B having the same structure as the actuator 65A is located between the movable shaft 63B and a support 64B fixed on the floor. The actuator 65B is adapted to apply a force to the movable shaft 63B in the +Y or −Y direction under an instruction from the controller 19a. Also, an actuator 65C composed of a stationary element 66C and a movable element 67C is located between the central portion of the side wall of the first column 23 (or the surface plate 9) on the side of the +X direction and a support 64C fixed on the floor. The actuator 65C is adapted to apply a force to the first column 23 (or the surface plate 9) in the +X or −X direction under an instruction from the controller 19a.

Back in FIG. 10, the supports 64A, 64B, and 64C are fixed to the floor and stand along the first column 23. Let the center of gravity of a system formed of the surface plate 9, the wafer stage 10, the wafer holder 10a, the first column 23, the projection optical system 3, the second column 22, and the reticle stage 2 be located at position G. Also, let the center of connection between the movable shaft 63A and the first column 23 and between the movable shaft 63B and the first column 23 be taken as points of application, AP and BP, for the actuators 65A and 65B, respectively. As shown in FIG. 12, let the center of connection between the movable element 66C of the actuator 65C and the first column 23 be taken as a point of application, CP. In the present embodiment, three points of application, AP, BP, and CP, are set to be identical in a position in the Z direction (height) with position G of the center of gravity of the system.

The operation of the aforesaid present embodiment will now be described. In the present embodiment, as shown in FIGS. 10 and 12, the control apparatus 19a is inputted with a reaction force which is applied to the surface plate 9 from each of the vibration isolation mounts 52A to 52D and measured by each of the load sensors 53A to 53D. The controller 19a is also inputted with data on the degree of levelness of the surface plate 9 which is measured by the level sensor 61 provided on the surface plate 9 and height of the surface plate 9 which is measured by the displacement sensor 60. Based on these data, the controller 19a calculates a height for vibration dampers or vibration isolation mounts 52A to 52D so as to bring height and level (inclination) of the surface plate 9 to preset values. At that time, a height of each vibration isolation mount 52A to 52D is determined so as to bring about a balance among reaction forces which are transmitted from the vibration isolation mounts 52A to 52D to the surface plate 9, to a preset state. Then, the controller 19a regulates the vertical motion mechanisms 51A to 51D so as to bring the level of vibration isolation mounts 52A to 52D to respective calculated heights. Subsequently, the level of vibration isolation mounts 52A to 52D are maintained at the respective set values. Thus, the surface plate 9 is free of any distortion, whereby the positioning of the wafer stage 10 on the surface plate is maintained with a high degree of accuracy.

As shown in FIG. 12, acceleration data having six degrees-of-freedom which is detected by the acceleration sensor 62 on the surface plate 9 is supplied to the controller 19a. The controller 19a drives the four Z-direction actuators 55A to 55D, the two Y-direction actuators 65A and 65B, and the one X-direction actuator 65C so as to bring individual accelerations having six degrees-of-freedom to zero. Thus, vibration having six degrees-of-freedom of an exposure unit on the surface plate 9 can be suppressed.

The point of application, CP, of the X-axis actuator 65C and the points of application, AP and BP, of the two Y-axis actuators 65A and 65B are substantially identical in a position in the Z direction (height) with position G of the center of gravity of a vibration system (an object whose vibration is to be suppressed) on the surface plate 9 of the present embodiment. Accordingly, without generating rotation about the X-axis and Y-axis, rotation about the Z-axis and translational vibration in the X-axis and Y-axis can be controlled by means of the X-axis actuator 65C and the Y-axis actuators 65A and 65B, whereby interaxis interference is minimized.

According to the above-mentioned present embodiment, the point of application, CP, of the X-axis actuator 65C and the points of application, AP and BP, of the Y-axis actuators 65A and 65B are set substantially identical in height with position G of the center of gravity. However, when some interaxis interference is acceptable, the points of application, AP, BP and CP, are not necessarily identical in height with position G of the center of gravity. Also, for example, only the point of application, CP, of the X-axis actuator 65C may be set to be identical in height with position G of the center of gravity.

The above description of the present embodiment concerns the vibration isolation apparatus which is applied to a stepper, or a stepping projection exposure apparatus. The vibration isolation apparatus according to the present embodiment is also applicable to a scanning projection exposure apparatus such as a projection exposure apparatus of step-and-scan type. In particular, a vibration isolation base provided with actuators for controlling or suppressing vibration of the surface plate 9 as in the present embodiment is effective for a scanning exposure apparatus in which large acceleration occurs at the time of starting a scanning exposure.

Also, in FIG. 10, the Z-direction actuators 55A to 55D are provided independently of the vertical motion mechanisms 51A to 51D. The vertical motion mechanisms 51A to 51D may also be used for the actuators 55A to 55D. However, using the actuators 55A to 55D which are disposed in parallel with the vibration isolation mounts 52A to 52D produces an advantage that vibration of the surface plate 9 can be suppressed at a higher response speed. Furthermore, more than four vibration isolation mounts may be disposed, and also an actuator having more than six degrees-of-freedom may be disposed.

According to the first vibration isolation apparatus of the present invention, the damping characteristic adjusting or varying device varies the vibration characteristics of the vibration damping devices in accordance with a state of movement of an object to be processed, whereby the vibration damping characteristic of the vibration isolation apparatus can be changed. Accordingly, for example, to prevent vibration from being transmitted to the stage apparatus of an exposure apparatus from outside, the rigidity of the vibration damping device is set to be lower. On the other hand, for example, to quickly converge vibration generated within the exposure apparatus in association with a movement of an object to be measured, the rigidity of the vibration damping device is increased.

Also, according to the stage apparatus of the present invention, the following two functions which are required of the vibration isolation apparatus of an exposure apparatus at the time of exposure and of moving a substrate stage can be fulfilled at lower cost: (a) reduction of transmission of vibration from floor and (b) quick damping of vibration generated within apparatus.

Furthermore, the vibration characteristic of the substrate stage should be considered in association with not only an exposure operation but various optical alignment operations and an operation of transferring a mask or photosensitive substrate to and from a handler for replacement thereof. According to the stage apparatus of the present invention, a plurality of rigidity values of the vibration damping device can be easily set by the damping characteristic adjusting device or varying so as to cope with these various operations.

Also, in the vibration isolation apparatus and stage apparatus of the present invention, in the case where predetermined one or more vibration damping devices have a movable body disposed in a predetermined viscous fluid and where the damping characteristic adjusting device varies the coefficient of viscous drag of the viscous fluid thereby to vary the damping coefficient, when, for example, an ER (electro-rheological) fluid whose coefficient of viscous drag varies with intensity of electric field is used as the viscous fluid, the coefficient of viscous drag of the viscous fluid varies only by controlling, through the damping characteristic varying device, a voltage which is applied to the viscous fluid from an external power source. This variation in the coefficient of viscous drag of the viscous fluid causes the damping coefficient to vary, whereby the vibration damping characteristic of the vibration damping device can be controlled according to a state of movement of the substrate stage. Furthermore, the vibration damping characteristic can be varied continuously over a predetermined range.

When the damping characteristic adjusting device is adapted to vary the spring constant by inserting one or more spring members between the installation surface and the base member in parallel with vibration damping devices whose damping characteristic is to be varied or removing them from therebetween, the vibration damping characteristic can be varied at a plurality of stages in a quite simple structure. This is implemented, for example, by inserting a plurality of spring members between or removing from between the installation surface and the base.

When an electrical actuator is used to vary the spring constant, a mechanism becomes simple. Furthermore, in distinction from a full active vibration isolation base where a complicated control is exercised according to values detected by displacement sensors or the like, control is exercised merely by varying a gain of position feedback or a force/displacement value, thereby producing an advantage that a control circuit is not so complex.

According to the second vibration isolation apparatus of the present invention, an amount of adjustment to be made by the height adjusting device is controlled according to the result of detection by a load sensor. Accordingly, balance among reaction forces which are applied to the base member (surface plate) from a plurality of vibration isolation mounts can be maintained in a desired state, thereby producing an advantage that a distortion of the base member can be lessened.

Also, by providing a vibration controlling or suppressing device, there arises an advantage of controlling or suppressing vibrations generated on the base member. Particularly, when a vibration suppressing device is arranged in parallel with vibration isolation mounts, vibrations generated on the base member can be suppressed by a smaller force and at a higher response speed.

According to the third vibration isolation apparatus of the present invention, balance among reaction forces which are applied to the base member from vibration dampers or vibration isolation mounts can be set to a desired stage, and vibration having six degrees-of-freedom and generated on the base member can be quickly suppressed using a total of seven or more vibration suppressing devices. Accordingly, the positioning of a mobile stage on the base member is maintained at a higher accuracy.

Also, when a point of application of a second vibration suppressing device for suppressing vibration of the base member in a first direction and a point of application of a third vibration suppressing device for suppressing vibration of the base member in a second direction are made substantially equal in height to the center of gravity of a system composed of the base member and the mobile stage, inter-axis interference is minimized.

Particularly, even when an exposure apparatus to which the present invention is applied is relocated, the level of an exposure unit (surface plate, wafer stage and the like) can be adjusted without deforming the exposure unit. Furthermore, when the center of gravity of the exposure unit changes as a result of adding a new mechanism for adding a new function thereto, height adjusting devices can be controlled so as to minimize a change of balance among reaction forces received from the vibration isolation mounts.

What is claimed is:

1. A vibration isolation apparatus, comprising:
   a base member that mounts an object to be processed;
   a plurality of vibration damping devices which are disposed on an installation surface for said base member, the plurality of vibration damping device supporting said base member and damping vibrations between the installation surface and said base member; and
   a damping characteristic varying device that is connected with one or more vibration damping devices among said plurality of vibration damping devices, and varies at least either one of a spring constant and a damping coefficient of predetermined one or more vibration damping devices in accordance with a state of movement of the object to be processed,
   wherein said predetermined one or more vibration damping devices have an electrical actuator that applies a force to said base member from the installation surface in response to a position sensor signal, and
   said damping characteristic varying device varies again applied to the position sensor signal before input to the electrical actuator.

2. A vibration isolation apparatus according to claim 1, wherein the electrical actuator is a voice coil motor type actuator.

3. A vibration isolation apparatus according to claim 1, wherein the electrical actuator comprises a spindle, a threaded shaft which engages with a nut portion of the spindle, and a motor that rotates the threaded shaft.

4. A stage apparatus, comprising;
   a base member;
   a substrate state that is mounted on said base member and moves a substrate two-dimensionally;
   three or more vibration damping devices which are disposed on an installation surface for said base member, the three or more vibration damping devices supporting said base member and damping vibrations between the installation surface and said base member;
   a damping characteristic varying device that is connected with one or more vibration damping devices among said three or more vibration damping devices, and varies at least either one of a spring constant and a damping coefficient of predetermined one or more vibration damping devices in accordance with a state of movement of said substrate stage,
   wherein said predetermined one or more vibration damping devices have an electrical actuator that applies a force to said base member from the installation surface in response to a position sensor signal, and
   said damping characteristic varying device varies a gain applied to the position sensor signal before input to the electrical actuator.

5. A stage apparatus according to claim 4, wherein the electrical actuator is a voice coil motor type actuator.

6. A stage apparatus according to claim 4, wherein the electrical actuator comprises a spindle, a threaded shaft which engages with a nut portion of the spindle, and a motor that rotates the threaded shaft.

7. A scanning exposure apparatus which moves a mask with respect to an optical system while illuminating the mask on which a transfer pattern is formed and synchronously moves a substrate with respect to the optical system, thereby exposing the pattern on the mask onto the substrate using the optical system, comprising:
   a movable substrate stage that holds said substrate;

a base member on which a frame that supports said projection optical system and said substrate stage are mounted;

three or more vibration damping devices that are connected with said base member and support said base member; and a controller connected with at least one of said three or more vibration damping devices, the controller varying at least either one of a spring constant and a damping coefficient of the vibration damping devices so that a rigidity of the vibration damping devices in a first period when the mask and the substrate are moving at the fixed scanning velocity for the scanning exposure differs from a rigidity of the vibration damping devices in a second period when the mask and the substrate are accelerating or decelerating toward the fixed scanning velocity.

8. A vibration isolation apparatus, comprising:

a base member on which an object to be processed is mounted;

a plurality of vibration damping devices which are disposed between said base member and an installation surface in different positions;

a level sensor connected to said base member to detect a level of said base member;

a plurality of load sensors that detect a load which is placed by said base member on each of said plurality of vibration damping devices; and a plurality of height adjusting devices that are connected with each of said plurality of vibration damping devices, and adjust a height of each of said plurality of vibration damping devices in accordance with the result of detection by said plurality of load sensors and said level sensor.

9. A vibration isolation apparatus according to claim 8, further comprising a plurality of vibration controlling devices that are disposed between said base member and the installation surface in parallel with said plurality of vibration damping devices.

10. A vibration isolation apparatus, comprising:

a base member on which a movable stage is mounted, the movable stage positioning an object to be processed in first and second directions intersecting each other;

a level sensor connected to said base member to detect a level of said base member;

four vibration damping devices which are disposed between said base member and an installation surface in different positions;

four load sensors that detect a load which is placed by said base member on each of said plurality of vibration damping devices;

four height adjusting devices that are connected with each of said four vibration damping devices and adjusting a height of each of said four vibration damping devices in accordance with the result of detection by said four load sensors and said level sensor;

four first vibration controlling devices that are disposed in parallel with said four height adjusting devices and that control vibration of said base member in a direction of height;

two or more second vibration controlling devices that control vibration of said base member in the first direction;

one or more third vibration controlling devices that control vibration of said base member in the second direction; and a controller connected with said four first vibration controlling devices, said two or more second vibration controlling devices, and said one or more third vibration controlling devices, the controller controlling each of said first, second and third vibration controlling devices.

11. A vibration isolation apparatus according to claim 10, wherein points of application of said second vibration controlling devices that control vibration of said base member in the first direction and a point of application of said third vibration controlling device that control vibration of said base member in the second direction are made substantially equal in height to the center of gravity of a system comprising said base member and the movable stage.

12. A vibration isolation apparatus according to claim 10, wherein the object to be processed is a substrate and wherein an apparatus that transfers by exposure a mask pattern onto the substrate is mounted on said base member.

13. An exposure apparatus, comprising:

an exposure system which exposes a substrate with an image of a pattern on a mask, said exposure system including a substrate stage that moves the substrate in first and second directions perpendicularly intersecting each other and a mask stage that moves the mask;

a base member on which said exposure system is mounted and which is supported on three or more vibration damping devices;

a plurality of first vibration controlling members which are connected to said base member with said vibration controlling members being separated from said three or more vibration damping devices and which control vibration of said base member in a direction of height; and at least three second vibration controlling members which arc connected to said exposure system and which control vibration of said exposure system on a plane including the first and second directions.

14. An apparatus according to claim 13, wherein said second vibration controlling members are formed of an electromagnetic actuator and are provided outside said base member.

15. An apparatus according to claim 14, further comprising:

members that hold said base member in such a manner that points of application of said second vibration controlling members become substantially equal in height to the center of gravity of a system comprising said exposure system and said base member.

16. An apparatus according to claim 13, wherein said exposure system includes a projection optical system that projects an image of a pattern on the mask onto the substrate and a frame that supports the projection optical system on said base, and wherein said second vibration controlling members are connected to the frame.

17. An apparatus according to claim 13, further comprising:

load sensors that detect a load which is applied by said base member to each of said three or more vibration damping devices; and a device that adjusts a height of each of said three or more vibration damping devices in accordance with output of said load sensors.

18. An exposure apparatus comprising:

an exposure unit which is disposed on a vibration isolation unit so that vibration from a floor is substantially isolated, said exposure unit including a projection optical system disposed between a mask and a substrate, a first frame which supports at least a part of said projection optical system, a mask stage which moves said mask, a substrate stage which moves said substrate, and a base member which movably supports said stage moves;

a first vibration damping system disposed between said base member and said floor with said system being separated from said vibration isolation unit so that vibration of said stage along an optical axis of said projection optical system is damped; and a second vibration damping system disposed between said exposure unit and said floor being separated from said first vibration damping system and said vibration isolation unit so that vibration of said mask stage and said substrate stage on a plane perpendicular to said optical axis of said projection optical system is damped.

19. An apparatus according to claim 18, wherein said exposure unit includes a second frame disposed on said first frame and a second stage which holds said mask and moves on said second frame.

20. An apparatus according to claim 18, wherein said first vibration damping system includes a plurality of first actuators connected to said base member.

21. An apparatus according to claim 20, wherein said first actuators are non-contacting type actuators which isolate vibration from said floor.

22. An apparatus according to claim 21, wherein the number of said plurality of first actuators is four and said first actuators are disposed on a base plate mounted on said floor.

23. An apparatus according to claim 22, wherein each of said first actuators includes a magnet and a coil, one of said magnet and coil being disposed on said base member and the other being disposed on said base plate.

24. An apparatus according to claim 22, wherein said vibration isolation unit is disposed on said base plate.

25. An apparatus according to claim 18, wherein said second vibration damping system includes a third frame mounted on said floor and a second actuator which connects said third frame and a part of said exposure unit.

26. An apparatus according to claim 25, wherein said second actuator is a non-contacting type actuator which isolates vibration from said floor.

27. An apparatus according to claim 26, wherein said second actuator includes a magnet and a coil, one of said magnet and coil being disposed on said third frame and the other being disposed on said part of said exposure unit.

28. An apparatus according to claim 27, wherein one of said magnet and coil is mounted on said first frame.

29. An apparatus according to claim 25, wherein said second actuator includes at least two non-contacting type actuators which damp vibration of said stage in a first direction along said plane perpendicular to said optical axis of said projection optical system and at least one non-contacting type actuator which damps vibration of said stage in a second direction perpendicular to said first direction in said plane.

30. An apparatus according to claim 18, wherein said first vibration damping system includes four non-contacting type actuators which isolate vibration from said floor and said second vibration damping system includes at least three non-contacting type actuators which isolate vibration from said floor.

31. An apparatus according to claim 18, wherein said vibration isolation unit includes four dampers which Support said exposure unit, said apparatus further comprising a controller connected to said four dampers in order to vary at least one of a spring constant and a damping coefficient of said damper.

32. An exposure apparatus comprising:

an exposure unit which includes a projection optical system disposed between a mask and a substrate, a first frame which supports at least a part of said projection optical system, a stage which supports said substrate, and a base member on which said stage moves;

a leveling sensor that detects a level of said base member;

a first vibration damping system disposed between said base member and said floor, said first vibration damping system having a fluid actuator and an electrical actuator to suppress vibration of said stage along an optical axis of said projection optical system based on an output of said leveling sensor; and a second vibration damping system disposed between said exposure unit and said floor so that vibration of said stage along an optical axis of said projection optical system is damped, wherein said first vibration damping system includes a plurality of first actuators connected to said base member; and wherein each of said first actuators are a non-contacting type actuator which isolates vibration from said floor.

33. An apparatus according to claim 32, wherein the number of said plurality of first actuators is four and said first actuators arc disposed on a base plate mounted on said floor.

34. An apparatus according to claim 33, wherein each of said first actuators includes a magnet and a coil, one of said magnet and coil being disposed on said base member and the other being disposed on said base plate.

35. An exposure apparatus comprising:

an exposure unit which is disposed on a vibration isolation unit so that vibration from a floor is substantially isolated, said exposure unit including a projection optical system disposed between a mask and a substrate, a first frame which supports at least a part of said projection optical system, a stage which supports said substrate, and a base member on which said stage moves;

a leveling sensor that detects a level of said base member;

a first vibration damping system disposed between said base member and said floor with said system, said first vibration damping system having a fluid actuator and an electrical actuator to suppress vibration of said stage along an optical axis of said projection optical system based on an output of said leveling sensor; and a second vibration damping system disposed between said exposure unit and said floor so that vibration of said stage on a plane perpendicular to said optical axis of said projection optical system is damped, wherein said second vibration damping system includes a third frame mounted on said floor and a second actuator which connects said third frame and a part of said exposure unit.

36. An apparatus according to claim 35, wherein said second actuator is a non-contacting type actuator which isolates vibration from said floor.

37. An apparatus according to claim 36, wherein said second actuator includes a magnet and a coil, one of said magnet and coil being disposed on said third frame and the other being disposed on said part of said exposure unit.

38. An apparatus according to claim 37, wherein one of said magnet and said coil is mounted on said first frame.

39. An apparatus according to claim 35, wherein said second actuator includes at least two non-contacting type actuators which damp vibration of said stage in a first direction along said plane perpendicular to said optical axis of said projection optical system and at least one non-contacting type actuator which damps vibration of said stage in a second direction perpendicular to said first direction in said plane.

40. A scanning type exposure apparatus which synchronously moves a mask and a substrate and expose said substrate with a pattern on said mask by exposure light, comprising:

an exposure optical system disposed on a light path of said exposure light between said mask and said substrate;

a base member;

a mask stage that holds said mask;

movable stage that holds said substrate, said movable stage synchronizing said substrate with said mask held by said mask stage which is movably supported by said base member when scanning exposure is performed;

an actuator disposed between said base member and an installation surface on said base member, said actuator applying a force to said base member in a direction perpendicular to a plane along which said movable stage moves; and a controller connected with said actuator, said controller controlling said actuator so that vibration of said base member which is caused by synchronized movement of said movable stage with said mask held by said mask stage while performing a scanning exposure is compensated.

41. A scanning type exposure apparatus according to claim 40, wherein said base member holds said exposure optical system.

42. A scanning type exposure apparatus according to claim 40, further comprising:

an acceleration sensing device connected to said controller and detecting acceleration applied to said base member, wherein said controller controls said actuator based on detected acceleration.

43. A scanning type exposure apparatus according to claim 40, further comprising:

a level sensor connected to said controller that detects a deviation of an inclination angle of said base member from a reference surface, said controller controls said actuator based on the detected deviation.

44. A scanning type exposure apparatus according to claim 40, further comprising:

a displacement sensor connected to said controller that detects displacement of said base member from a reference surface, said controller controls said actuator based on the detected displacement.

45. A scanning type exposure apparatus according to claim 40, wherein said base member is supported on said installation surface at a plurality of points and said controller controls said actuator so that forces applied to said base member at said plurality of points have a predetermined relation with each other.

46. A scanning type exposure apparatus according to claim 40, wherein said controller controls said actuator so that the height of said base member becomes a predetermined value.

47. A scanning type exposure apparatus according to claim 40, wherein said controller controls said actuator so that the posture of said base member becomes a predetermined condition.

48. A scanning type exposure apparatus which synchronously moves a mask and a substrate to exposes a pattern of the mask onto the substrate, comprising:

a movable mask stage that holds the mask;

a movable substrate stage that holds the substrate;

a main frame that movably supports the movable mask stage and the movable substrate stage;

a projection system located between the movable mask stage and the movable substrate stage to project the pattern onto the substrate;

an actuator system that actuates the main frame in a direction along an optical axis of the projection optical axis of the projection optical system; and a controller connected with the actuator system to suppress a variation of the main frame which is caused by a movement of the mask and the substrate.

49. A scanning type exposure apparatus according to claim 48, wherein the actuator system comprises a fluid actuator and an electric actuator.

50. A scanning type exposure apparatus according to claim 48, wherein the fluid actuator comprises an air damper.

51. A scanning type exposure apparatus according to claim 48, wherein the electrical actuator comprises a magnet member and a coil member.

52. A scanning type exposure apparatus according to claim 48, further comprising a level sensor to detect a level of the main frame.

53. A scanning type exposure apparatus according to claim 52, wherein the controller controls the actuator system based on a detection result of said level sensor.

54. A scanning type exposure apparatus according to claim 48, wherein the controller controls the actuator system at least at the time of starting a scanning exposure.

55. A scanning type exposure apparatus according to claim 48, wherein the main frame supports the projection system.

* * * * *

UNITED STATES PATENT AND TRADEMARK OFFICE
CERTIFICATE OF CORRECTION

PATENT NO.    : 6,327,024 B1
DATED         : December 4, 2001
INVENTOR(S)   : Yutaka Hayashi et al.

It is certified that error appears in the above-identified patent and that said Letters Patent is hereby corrected as shown below:

Title page,
Item [63], change "Continuation of application No. 09/241,084, field on Feb. 1, 1999, which is a continuation of application No. 08/539,080, filed on Oct. 4, 1995, now abandoned." to be -- Continuation of application No. 09/241,084, field on Feb. 1, 1999, now abandoned, which is a continuation of application No. 08/539,080, filed on Oct. 4, 1995, now abandoned. --

Signed and Sealed this

Eighteenth Day of May, 2004

JON W. DUDAS
*Acting Director of the United States Patent and Trademark Office*